United States Patent
Sekiguchi et al.

(10) Patent No.: US 6,911,851 B2
(45) Date of Patent: Jun. 28, 2005

(54) DATA LATCH TIMING ADJUSTMENT APPARATUS

(75) Inventors: Yuji Sekiguchi, Nara (JP); Yoichiro Miki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/715,538

(22) Filed: Nov. 19, 2003

(65) Prior Publication Data

US 2004/0189360 A1 Sep. 30, 2004

(30) Foreign Application Priority Data

Nov. 21, 2002  (JP) ........................................ 2002-337925

(51) Int. Cl.$^7$ .............................. H03L 7/00; H03L 7/06
(52) U.S. Cl. ........................ 327/141; 327/158; 365/233
(58) Field of Search ............................... 327/141, 158, 327/161; 365/233, 233.5, 189.05, 189.07; 375/359, 362, 375, 376

(56) References Cited

U.S. PATENT DOCUMENTS

| | | | | |
|---|---|---|---|---|
| 4,908,614 A | * | 3/1990 | Yamagishi | 345/534 |
| 5,022,056 A | * | 6/1991 | Henderson et al. | 375/373 |
| 5,841,719 A | | 11/1998 | Hirata | 365/210 |
| 5,994,934 A | * | 11/1999 | Yoshimura et al. | 327/158 |
| 6,194,932 B1 | * | 2/2001 | Takemae et al. | 327/158 |
| 6,445,231 B1 | * | 9/2002 | Baker et al. | 327/158 |
| 6,605,969 B2 | * | 8/2003 | Mikhalev et al. | 327/158 |
| 6,741,110 B2 | * | 5/2004 | Roisen | 327/158 |
| 2003/0062936 | * | 4/2003 | Kennedy et al. | 327/158 |

FOREIGN PATENT DOCUMENTS

| | | |
|---|---|---|
| JP | 5-342085 | 12/1993 |
| JP | P2001-350668 A | 12/2001 |

* cited by examiner

*Primary Examiner*—Tuan T. Lam
(74) *Attorney, Agent, or Firm*—McDermott Will & Emery LLP

(57) ABSTRACT

In a data latch timing adjustment apparatus, a read control section reads out a first checking data piece in a checking data storing section written in a memory and outputs a latch pulse signal to a delay selecting section. A selection part outputs, to a latch circuit, a delayed pulse signal obtained by delaying the latch pulse signal by the front delay circuit. The latch circuit delays the checking data piece from the memory at the reception of the delayed pulse signal. Then, the next data piece is read out from the memory and the selection part outputs, to the latch circuit, a delayed pulse signal delayed by the delay circuit at the preceding stage.

36 Claims, 20 Drawing Sheets

PRIOR ART FIG. 16

DATA LATCH TIMING ADJUSTMENT APPARATUS

BACKGROUND OF THE INVENTION

The present invention relates to data latch timing adjustment apparatus for adjusting the timing of latching data which has been output from semiconductor circuits such as memories or LSIs.

The timing of reading out data from a memory is generally determined in designing the memory, so that the timing of reading out data changes depending on the position and characteristics of the memory and the influence of ambient temperatures, for example. Accordingly, if the readout data is latched at a fixed latch timing, the data is latched erroneously. In order to adjust the latch timing of the readout data, a DIP switch, for example, is conventionally provided to normally latch the output data from the memory.

However, this method has a drawback of requiring additional processes for this adjustment. In view of this, a timing adjustment circuit for automatically adjusting latch timing of data read out from a memory was proposed in, for example, Japanese Laid-Open Publication No. 2001-350668.

FIG. 16 is the block diagram showing a timing adjustment circuit disclosed in the publication. FIG. 16 shows a circuit for adjusting latch timing of data read out from a memory a, and in this circuit, a write control section b writes given data into the memory a at an address predetermined for checks. In this case, the data written at the address by the write control section b is stored in a write data storing section c.

A read control section d outputs a timing signal to the memory a to cause the data written into the memory a at the address to be read out and also outputs, to a latch pulse delaying section e, latch pulse signals for latching the data read out from the memory a using the timing signal. The latch pulse delaying section e includes (n+1) delay circuits e0 through en and delays the latch pulse signals from the read control section d by different amounts of time, thereby generating and outputting a plurality of delayed pulse signals. Each of (n+1) latch circuits f0 through fn receives the readout data from the memory a and an associated one of the latch pulse signals and n delayed pulse signals output from the latch pulse delaying section e, and latches the readout data from the memory a using the received pulse signal. Each of (n+1) comparison circuits g0 through gn compares the latched data from an associated one of the latch circuits f0 through fn with an associated one of the data pieces stored in the write data storing section c. A determination section h determines an optimum pulse signal for the latch timing of the readout data from the memory a from among the latch pulse signals and the delayed pulse signals from the latch pulse delaying section e based on results of comparison at the comparison circuits g0 through gn. A selection part i selects an output of one of the (n+1) latch circuits f0 through fn which has received the optimum latch timing, based on a result of determination at the determination section h.

In this manner, an optimum latch timing for the readout data from the memory a is determined and adjusted automatically, in the above publication.

If the operation speed of a memory further increases, data is also read out from the memory at higher speed and the time required for determining the readout data from the memory is shortened accordingly. Therefore, to normally latch the readout data from the memory, a detailed adjustment is needed.

However, in order to perform a detailed delay adjustment or enlarge the adjustable range, the technique disclosed in the publication needs a large number of delay circuits with small delays so that the latch pulse delaying section e generates a large number of delayed pulse signals with minute delay differences. As a result, the technique disclosed in the publication has a drawback of requiring a large number of latch circuits and comparison circuits associated with the large number of delayed pulse signals. This drawback is found not only in latch timing of the readout data from the memory but also in latch timing of data read out from LSIs in the same manner.

SUMMARY OF THE INVENTION

It is therefore an object of the present invention to provide a latch timing adjustment apparatus which can enhance the accuracy in delay adjustment without increasing the numbers of latch circuits and comparison circuits as described above, even in a case of increasing the operating speed of a memory or an LSI or enlarging the range in which latch timing is adjustable.

In order to achieve this object, according to the present invention, even if a large number of delay circuits for delaying signals are provided, the numbers of determination circuits and comparison circuits are reduced by a configuration in which a delay selecting section for sequentially selecting one from among the delay circuits is provided so as to sequentially select a delay circuit and allows, for example, data read out from the memory to be latched using a signal from the selected delay circuit.

Specifically, an inventive data latch timing adjustment apparatus is for adjusting latch timing of output data and is characterized by including: a delay selecting section for delaying the output data with a plurality of delay amounts respectively, generating a plurality of delayed output data pieces, and selecting and outputting one of the delayed output data pieces; a latch circuit for receiving the delayed output data piece selected by the delay selecting section and a latch pulse signal, and latching the delayed output data piece at a time of receiving the latch pulse signal; and a delay control section for controlling the delay selecting section such that one of the delayed output data pieces with a delay amount different from that of the preceding delayed output data piece is selected by the delay selecting section and the current delayed output data piece is input to the latch circuit every time the latch pulse signal is input to the latch circuit.

The inventive data latch timing adjustment apparatus is characterized in that the delay selecting section includes a plurality of delay circuits connected in series.

The inventive data latch timing adjustment apparatus is characterized in that the delay selecting section includes a DLL.

The inventive data latch timing adjustment apparatus is characterized by including: a comparison circuit for comparing the data piece latched by the latch circuit with an associated checking data piece to determine whether or not the latched data piece and the checking data piece match each other; and a determination section for receiving a plurality of comparison results from the comparison circuit, and determining, based on the comparison results, a delay amount in the delay selecting section with which the latch circuit latches the data piece appropriately.

The inventive data latch timing adjustment apparatus is characterized in that if the comparison results at the comparison circuit include successive matching results, the determination section determines that a delay amount located at the center of a plurality of delay amounts in the delay selecting section associated with the successive matching results is an appropriate delay amount.

The inventive data latch timing adjustment apparatus is characterized in that if the comparison results at the comparison circuit include successive matching results, the determination section determines that the smallest one of a plurality of delay amounts in the delay selecting section associated with the successive matching results is an appropriate delay amount.

The inventive data latch timing adjustment apparatus is characterized in that if the comparison results at the comparison circuit include successive matching results, the determination section determines that a delay amount shifted in consideration of a tendency in variation of an ambient temperature from a delay amount located at the center of a plurality of delay amounts in the delay selecting section associated with the successive matching results is an appropriate delay amount.

The inventive data latch timing adjustment apparatus is characterized in that the determination section considers all the comparison results at the comparison circuit and determines that a delay amount in the delay selecting section associated with one of the comparison results having a high probability of being selected is an appropriate delay amount.

The inventive data latch timing adjustment apparatus is characterized in that the output data is data read out from a memory, and the latch circuit is provided in an LSI which receives the data read out from the memory.

The inventive data latch timing adjustment apparatus is characterized in that the output data is data output from a first LSI, and the latch circuit is provided in a second LSI which receives the data output from the first LSI.

The inventive data latch timing adjustment apparatus is characterized in that the memory or the first LSI operates in synchronization with a clock signal, and the latch pulse signal to be input to the delay selecting section is substituted by the clock signal.

The inventive data latch timing adjustment apparatus is characterized in that the memory is a memory which outputs a strobe signal as well as the data, and the latch pulse signal to be input to the delay selecting section is substituted by the strobe signal output from the memory.

The inventive data latch timing adjustment apparatus is characterized in that the output data is data of n (n is an integer of two or more) bits, and the latch circuit and the comparison circuit are respectively provided n in number.

The inventive data latch timing adjustment apparatus is characterized in that the output data is data of n (n is an integer of two or more) bits, the latch circuit is provided n in number, the comparison circuit is provided singular in number, and a selection section for selecting one of the n latch circuits is placed between the n latch circuits and the comparison circuit.

The inventive data latch timing adjustment apparatus is characterized in that the latch circuit latches the output data at rising and falling edges of the latch pulse signal, and the delay selecting section, the latch circuit and the comparison circuit are provided in two sets such that one of the two sets is for a rising edge of the latch pulse signal and the other set is for a falling edge thereof.

The inventive data latch timing adjustment apparatus is characterized in that the output data is data read out from a memory which outputs a strobe signal as well as the data, and the latch pulse signal is substituted by the strobe signal output from the memory.

The inventive data latch timing adjustment apparatus is characterized in that the latch circuit latches the output data at rising and falling edges of the latch pulse signal, the latch circuit and the comparison circuit are provided in two sets such that one of the two sets is for a rising edge of the latch pulse signal and the other set is for a falling edge thereof, the delay selecting section is provided singular in number, and the delayed output data piece selected by the delay selecting section is input to the latch circuit for the rising edge and to the latch circuit for the falling edge.

The inventive data latch timing adjustment apparatus is characterized in that the latch pulse signal is input to the delay selecting section.

The inventive data latch timing adjustment apparatus is characterized in that the output data is input to the delay selecting section.

The inventive data latch timing adjustment apparatus is characterized in that the output data is data read out from a memory, the checking data piece is stored in a checking data storing section beforehand, and in reading the output data from the memory, the checking data piece stored in the checking data storing section is written into the memory prior to the readout of the output data, and then the checking data piece is read out as the output data from the memory.

The inventive data latch timing adjustment apparatus is characterized in that the checking data piece is stored in the checking data storing section in a pattern in which a crosstalk between adjacent bits in the memory is taken into consideration.

The inventive data latch timing adjustment apparatus is characterized in that after the determination section has determined the appropriate delay amount in the delay selecting section, the delay control section controls the delay selecting section such that delay amounts are sequentially increased or decreased relative to the appropriate delay amount in subsequent latch timing adjustments.

The inventive data latch timing adjustment apparatus is characterized in that in increasing or decreasing the delay amounts sequentially relative to the appropriate delay amount, the delay control section limits the increase or decrease of the delay amounts within a given range.

The inventive data latch timing adjustment apparatus is characterized in that the delay control section sequentially selects part of a plurality of delay amounts in the delay selecting section and determines that a range of delay amounts located among some of the part of the delay amounts with which the data piece is appropriately latched is a target of a next selection, and in the next selection, the delay control section sequentially selects delay amounts included in the range of delay amounts which is the target of the selection to finally determine the appropriate delay amount based on one or more delay amounts with which the data piece is appropriately latched.

Therefore, according to the present invention, latch pulse signals at the same timing are input to a latch circuit. In addition, a plurality of data pieces are delayed with mutually differing amounts, and then are input to the latch circuit to be latched with the latch pulse signals at the same timing. Then, a comparison circuit detects matching or mismatching between each of the data pieces latched by the latch circuit and an associated checking data piece. Accordingly, even in a case where the accuracy in latch timing adjustment is to be enhanced or the range of latch timing adjustment is to be enlarged, only one latch circuit and one comparison circuit are enough, so that increase in circuit scale is effectively suppressed.

In particular, according to the present invention, since latch pulse signals at the same timing are input to the latch circuit, the timing of outputting data from an output data terminal does not change. Accordingly, a peripheral circuit for latching the data output from the output data terminal is easily designed.

In addition, according to the present invention, if the data is n-bit data, n latch circuits are provided but only one comparison circuit is sufficient because data pieces latched by these latched circuits are selected one by one by a selection section to be sequentially compared with an associated checking data piece by the comparison circuit. Accordingly, enlargement of circuit scale is further suppressed.

Further, in a case where the checking data pieces are stored in a memory beforehand, the checking data pieces might be destroyed or lost because of the influence of noise, for example. However, according to the present invention, in adjusting latch timing, the checking data pieces are written into the memory prior to the adjustment and then the checking data pieces are read out, so that the checking data pieces are normally read out. As a result, erroneous adjustment of the latch timing is effectively prevented even under the influence of noise, for example.

Moreover, according to the present invention, in a case where a plurality of data bits are read out from the memory at the same time, the checking data pieces are stored in a checking data storing section in a pattern in which a crosstalk between adjacent bits in the memory is taken into consideration. Accordingly, even under the influence of a change in a signal between bits in the memory, an optimum latch timing can be determined.

Furthermore, according to the present invention, the latch timing can be adjusted using only part of delay amounts in a delay selecting section. Accordingly, it is unnecessary to select all the delay amounts sequentially, so that the latch timing adjustment is completed in a short time.

DESCRIPTION OF THE PREFERRED EMBODIMENTS

Hereinafter, data latch timing adjustment apparatuses according to preferred embodiments of the present invention will be described with reference to the drawings.

Embodiment 1

Figure 1:
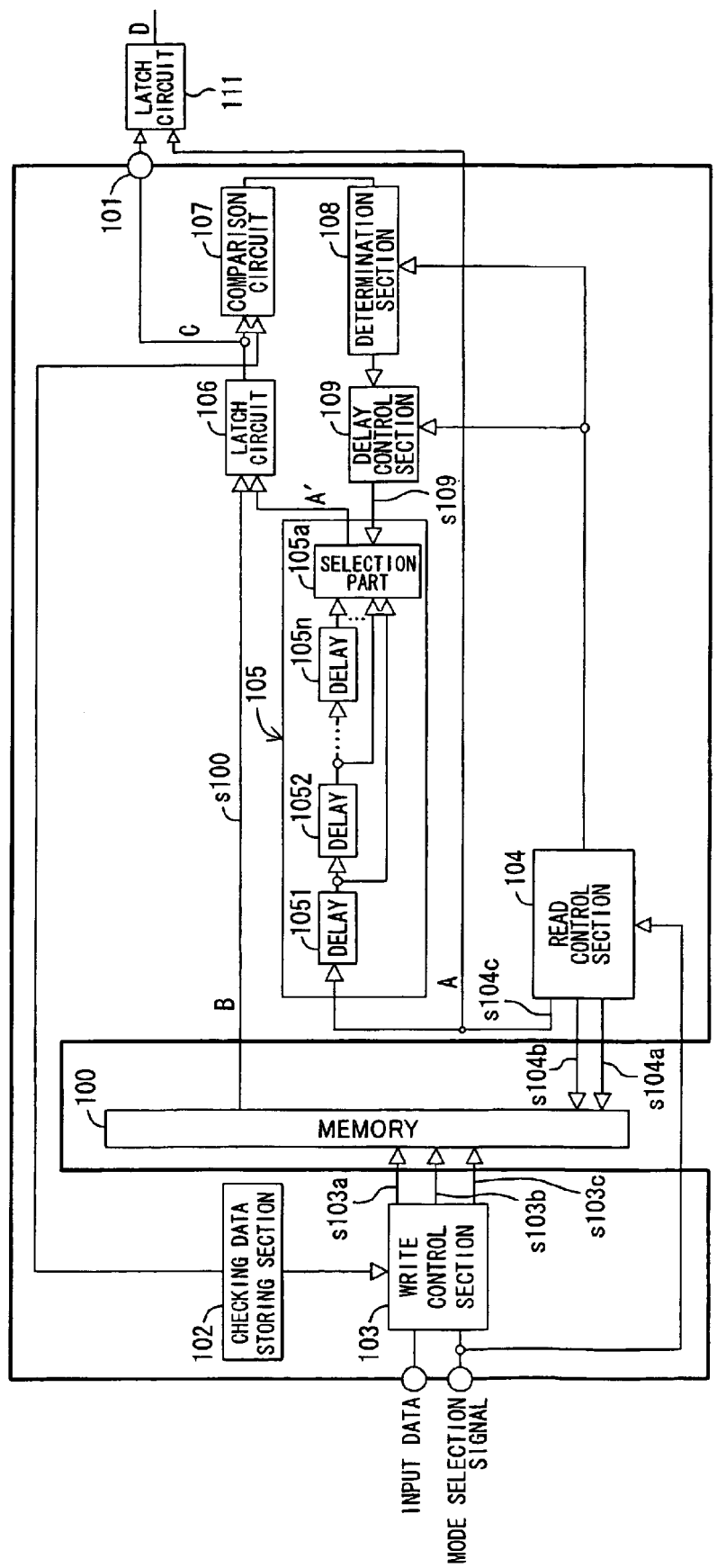
FIG. 1 is a block diagram showing a data latch timing adjustment apparatus according to a first embodiment of the present invention.

FIG. 1 shows a data latch timing adjustment apparatus according to a first embodiment of the present invention. The adjustment apparatus shown in FIG. 1 adjusts the timing of latching output data (readout data) from a memory 100. Circuits and other components except for the memory 100 and a latch circuit 111 are integrated in an LSI.

In FIG. 1, reference numeral 102 denotes a checking data storing section which stores checking data pieces for use in a latching timing adjustment of the readout data from the memory 100 beforehand. If multiple bits of data are read out from the memory 100 at the same time, these checking data pieces are stored beforehand in a pattern in which a crosstalk, which is interference between adjacent bits in the memory 100, is taken into consideration. For example, the data pieces are stored in consideration of cases where a signal adjacent or close to a bit to be subjected to a latch timing adjustment changes in the same phase or in the opposite phase relative to the bit.

Reference numeral 103 denotes a write control section which receives a mode selection signal and writes input data into the memory 100 at a given address if the mode selection signal indicates a normal operation mode, while writing the data stored in the checking data storing section 102 into the memory 100 if the mode selection signal indicates a latch timing adjustment mode. Specifically, the write operation control section 103 supplies a timing signal s103a, an address s103b, data (input data or checking data) s103c to the memory 100, and writes the data into the memory 100 at the given address.

Reference numeral 104 denotes a read control section which receives the mode selection signal and, in both of the normal operation mode and the latch timing adjustment mode, supplies a timing signal s104a and an address signal s104b to the memory 100 to read given data s100 from the memory 100 and to output a latch pulse signal s104c for latching the data read out from the memory 100 to a delay selecting section 105, which will be described later. In addition, when the latch timing adjustment mode terminates, the read control section 104 outputs a delay determination signal to a determination section 108 and a delay control section 109, which will be described later.

Reference numeral 105 denotes a delay selecting section including a plurality of delay circuits 1051, 1052 through 105n and a selection part 105a connected in series. The delay selecting section 105 sequentially delays the latch pulse signal s104c from the read control section 104 using the delay circuits 1051 through 105n, generates a plurality of delayed pulse signals having mutually different delay amounts, and selects and outputs one of the outputs from the delay circuits 1051 through 105n using a selection part 105a.

Reference numeral 106 denotes a latch circuit which receives the readout data s100 from the memory 100 and also receives the delayed pulse signal from one of the delay circuits selected by the selection part 105a of the delay selecting section 105, to latch the readout data s100 from the memory 100 at the time of receiving the delayed pulse signal. In the normal operation mode, the data latched by the latch circuit 106 is output through an output terminal 101. Reference numeral 107 denotes a comparison circuit which compares the readout data latched by the latch circuit 106 and an associated data piece stored in the checking data storing section 102 to detect matching or mismatching of these data items.

Reference numeral 108 denotes a determination section which receives the delay determination signal from the read control section 104 when the latch timing adjustment mode terminates and which determines one of the delay circuits 1051 through 105n which allows the readout data from the memory 100 to be appropriately latched by the latch circuit 106, i.e., determines a delayed pulse signal having an optimum delay amount, based on a plurality of comparison results at the comparison circuit 107.

Now, a specific determination process at the determination section 108 will be described. If only one of the comparison results at the comparison circuit 107 shows matching of the data items, a delayed pulse signal from the associated delay circuit is determined to be optimum. If a given number of successive comparison results show matching of the data items, a delayed pulse signal from a delay circuit located at the center of delay circuits associated with the successive results of matching, i.e., the most stable delayed pulse signal, may be determined to be optimum or a delayed pulse signal from a delay circuit located at the earliest stage out of the associated delay circuits may be determined to be optimum. In a case of selecting the delay circuit at the earliest stage, the readout data from the memory 100 can be latched at earlier timings. In addition, results of determination performed at multiple times may be united in such a manner that, based on comparison results at the comparison circuit 107, one of the comparison results having the highest probability of being selected is selected and a delayed pulse signal from a delay circuit associated with the selected comparison result is determined to be optimum. For example, results of multiple (e.g., five) comparisons at the comparison circuits 107 may be stored and the delay circuit to be selected may be updated for the first time when a given number (e.g., three) of comparison results showing matching of the data items are successive or, even if the results are not successive, a given number (e.g., four) of comparison results showing the matching are included. In such a case, the possibility of erroneous determination due to, for example, noise is eliminated, thus obtaining stable operation. In addition, in a case where a given number of comparison results showing matching of the data items are successive, it is possible to appropriately select one delay circuit depending on environments such as whether the memory 100 is used is in a cold or warm climate area, or depending on whether or not there is heat-producing electronic equipment near the memory 100. For example, the fact that if the delay of the delayed pulse signal is larger than the delay of the readout data and the ambient temperature around the memory 100 increases with the operation of electric equipment, the difference in delay between the delayed pulse signal and the readout data becomes wide is taken into consideration beforehand, and a delay circuit shifted from the center of the selectable delay circuits in consideration of a tendency in variation of the ambient temperature, i.e., toward a delay circuit outputting a delayed pulse signal with a smaller amount of delay (i.e., at an earlier stage), is selected.

In FIG. 1, reference numeral 109 denotes a delay control section which controls the selection part 105a such that the selection part 105a selects one of the delay circuits 1051 through 105n in order from the front thereof to output a delayed pulse signal with a delay amount different from that of the preceding signal during the latch timing adjustment mode. In addition, when the latch timing adjustment mode terminates, the delay control section 109 receives the delay determination signal from the read control section 104 and controls the selection part 105a such that the selection part 105a selects the output of one of the delay circuits determined by the determination section 108 (i.e., an optimum delayed pulse signal).

Further, in FIG. 1, reference numeral 111 denotes a latch circuit provided outside the LSI. The latch circuit 111 receives the data output from the latch circuit 106 in the LSI through the output terminal 101 and also receives the latched pulse signal s104c from the read control section 104, to latch the data from the output terminal 101 when receiving the latch pulse signal s104c.

Now, a latch timing adjustment of the data latch timing adjustment apparatus shown in FIG. 1 will be described.

First, an address at which checking data pieces from the checking data storing section 102 are stored in the memory 100 in a latch timing adjustment is defined.

Next, in the latch timing adjustment of the readout data from the memory 100, the mode selection signal is changed to direct a latch timing adjustment mode. This direction toward the latch timing adjustment mode may be given every time the power is turned ON, periodically given by counting set time, given at very one field if the readout data from the memory 100 is an audio signal, or given at every blanking period during which an audio signal is switched to a next audio signal, or may be given in combination of these methods. In this latch timing adjustment, the write control section 103 supplies checking data pieces s103c from the checking data storing section 102, an address s103b at which the data pieces s103c are stored in the memory 100 and a write timing signal s103a, to the memory 100 and writes the checking data pieces s103c into the memory 100 at the given address. These operations are repeated so that the plurality of checking data pieces s103c from the checking data storing section 102 are written into the memory 100. In this manner, in performing every latch timing adjustment of the readout data, one of the checking data pieces s103a in the checking data storing section 102 is written into the memory 100 prior to the timing adjustment.

Thereafter, the read control section 104 supplies the address signal s104b specifying the address at which one of the checking data pieces is stored and the read timing signal s104a to the memory 100 to read out the checking data piece from the memory 100 and outputs the latch pulse signal s104c to the delay selecting section 105. Then, the above operations are repeated such that a plurality of data pieces written into the memory 100 are sequentially read out. During these operations, the delay control section 109 receives a control signal from the read control section 104 and outputs a delay selection signal to the selection part 105a such that delayed pulse signals from the delay circuits 1051 through 105n are selected in order from the delay circuit 1051 located at the front of the delay circuits in the delay selecting section 105.

As a result, firstly, the latch circuit 106 receives the first readout data from the memory 100 and the delayed pulse signal from the front delay circuit 1051 in the delay selecting section 105, to latch the first readout data at the time of receiving this delayed pulse signal. Then, the latch circuit 106 latches the second readout data from the memory 100 at the time of receiving the delayed pulse signal from the second delay circuit 1052 in the delay selecting section 105. Thereafter, the latch circuit 106 sequentially latches the k-th (k=3 through n) readout data at the time of receiving the k-th delayed pulse signal.

The comparison circuit 107 compares the latched data from the latch circuit 106 and a checking data piece from the checking data storing section 102 associated with the latched data and repeatedly detects matching or mismatching between these data items. When the latch timing adjustment terminates, the read control section 104 outputs a delay determination signal to the determination section 108. The determination section 108 determines one delay circuit which allows the readout signal to be appropriately latched by the latch circuit 106 from among the delay circuits 1051 through 105n, based on the plurality of comparison results at the comparison circuit 107. When a delay circuit, i.e., an optimum timing, is determined, the delay control section 109 receives the delay determination signal from the read control section 104 and controls the selection part 105a such that the selection part 105a selects the output of the delay circuit determined by the determination section 108 as an optimum delayed pulse signal.

Subsequently, when the mode selection signal is changed to direct the normal operation mode, the readout data from the memory 100 is latched by the latch circuit 106 at the time of receiving the optimum delayed pulse signal selected by the selection part 105a of the delay selecting section 105 and is output from the output terminal 101.

In the delay selecting section 105, a plurality of delayed pulse signals are generated using the plurality of delay circuit 1051 through 105n. However, even in a case where a large number of delay circuits are provided for the purpose of improving the accuracy in the latch timing adjustment or enlarging the timing adjustment range, these delayed pulse signals are sequentially selected one by one by the selection part 105a and input to the latch circuit 106, so that one latch circuit 106 and one comparison circuit 107 are enough, i.e., it is unnecessary to provide a large number of latch circuits and comparison circuits. Accordingly, only the increase in the number of delay circuits can enhance the accuracy in the latch timing adjustment and enlarge the timing adjustment range.

In addition, since the checking data pieces are stored beforehand in the checking data storing section 102 in a pattern in which a crosstalk between adjacent bits in the memory 100 is taken into consideration, data changes rapidly when the adjacent bits, for example, change in the same phase, whereas data changes slowly when the adjacent bits change in mutually opposite phases. The present invention enables a latch timing adjustment in which these changes are taken into consideration.

The latch circuit 111 is placed outside the LSI in FIG. 1. However, the latch circuit 111 may, of course, be placed inside the LSI.

MODIFIED EXAMPLE 1 OF EMBODIMENT 1

Now, a first modified example of the first embodiment will be described with reference to FIG. 2. In this modified example, the configuration of the delay circuit section 105 is modified.

Figure 2:
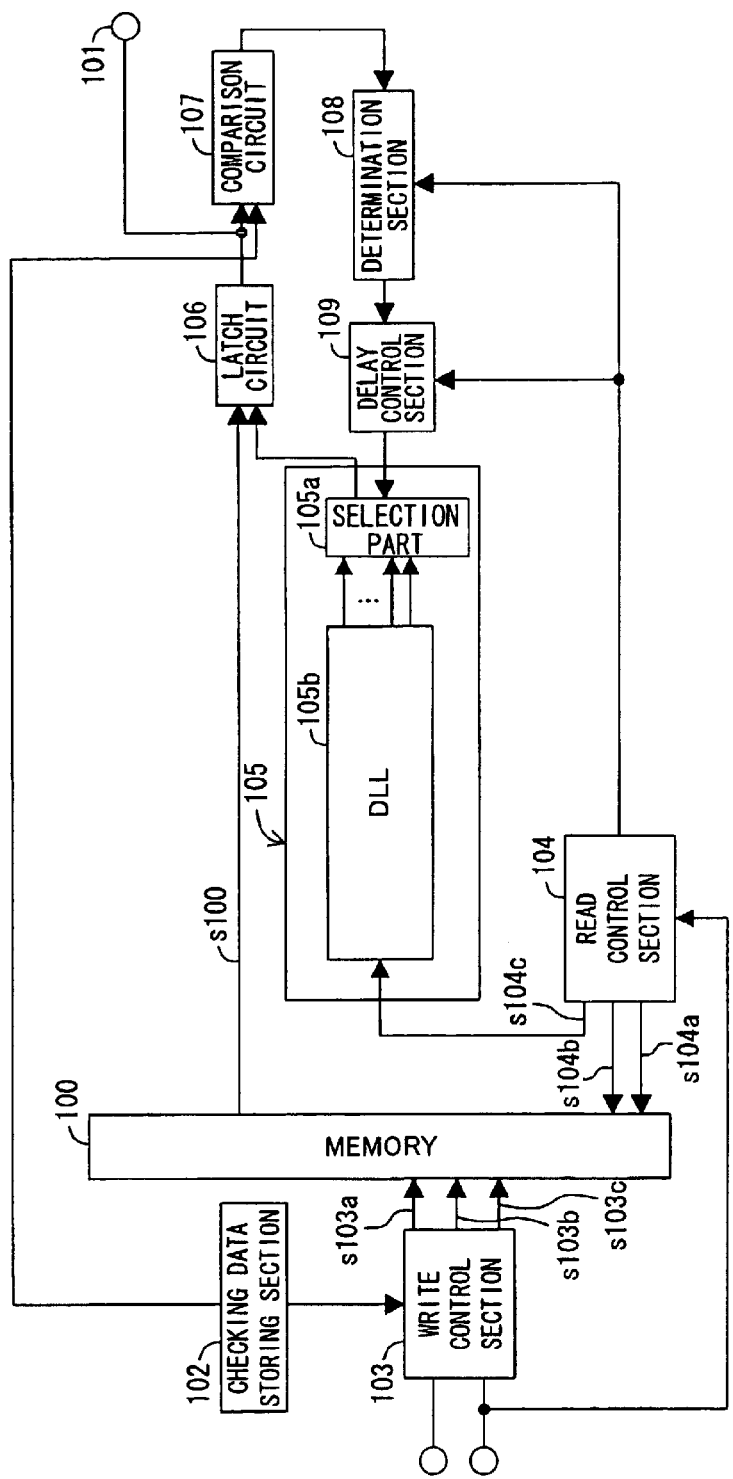
FIG. 2 is a block diagram showing a configuration of a data latch timing adjustment apparatus according to a first modified example of the first embodiment.

Specifically, as shown in FIG. 2, the delay selecting section 105 includes: a selection part 105a; and a delay locked loop (DLL) circuit 105b. The plurality of delay circuits 1051 through 105n shown in FIG. 1 are substituted by the DLL circuit 105b.

Figure 3:
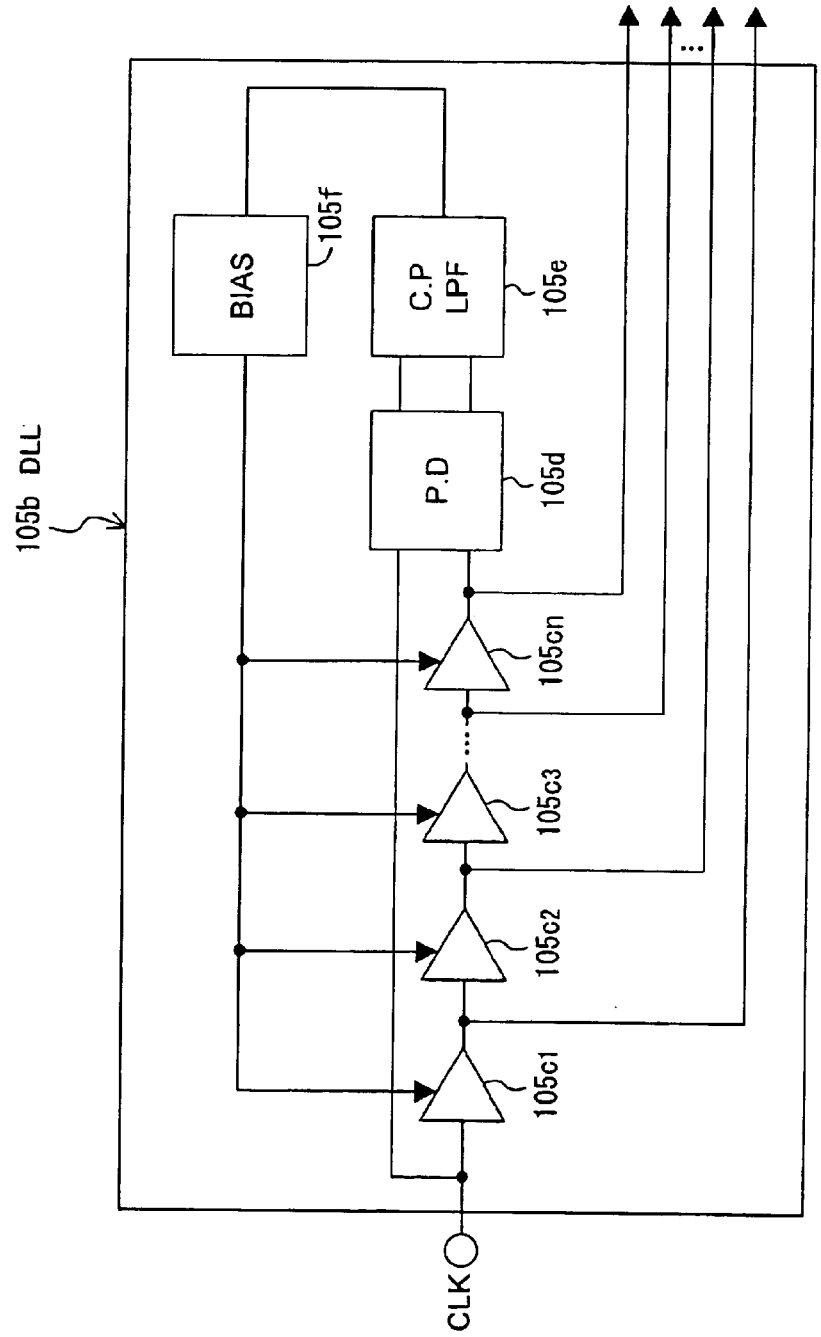
FIG. 3 is a block diagram showing an internal configuration of a DLL circuit provided in the data latch timing adjustment of the modified example.

An internal configuration of the DLL circuit 105b is shown in FIG. 3. In FIG. 3, the DLL circuit 105b has a function of keeping the delay amount constant even if conditions such as temperature and voltage change. The DLL circuit 105b includes: a plurality of delay buffers 105c1 through 105cn; a phase detection unit 105d; a charge pump and low pass filter 105e; and a bias circuit 105f. Respective outputs from the delay buffers 105c1 through 105cn are output to the selection part 105a as a plurality of delayed pulse signals.

Accordingly, in this modified example, the plurality of delayed pulse signals are generated by the DLL circuit 105b, so that a latch timing adjustment can be performed with high accuracy.

MODIFIED EXAMPLE 2 OF EMBODIMENT 1

Now, a second modified example of the first embodiment will be described with reference to FIG. 4. In this modified example, the memory 100 is an SDRAM which operates in synchronization with a clock signal CLK.

Figure 4:
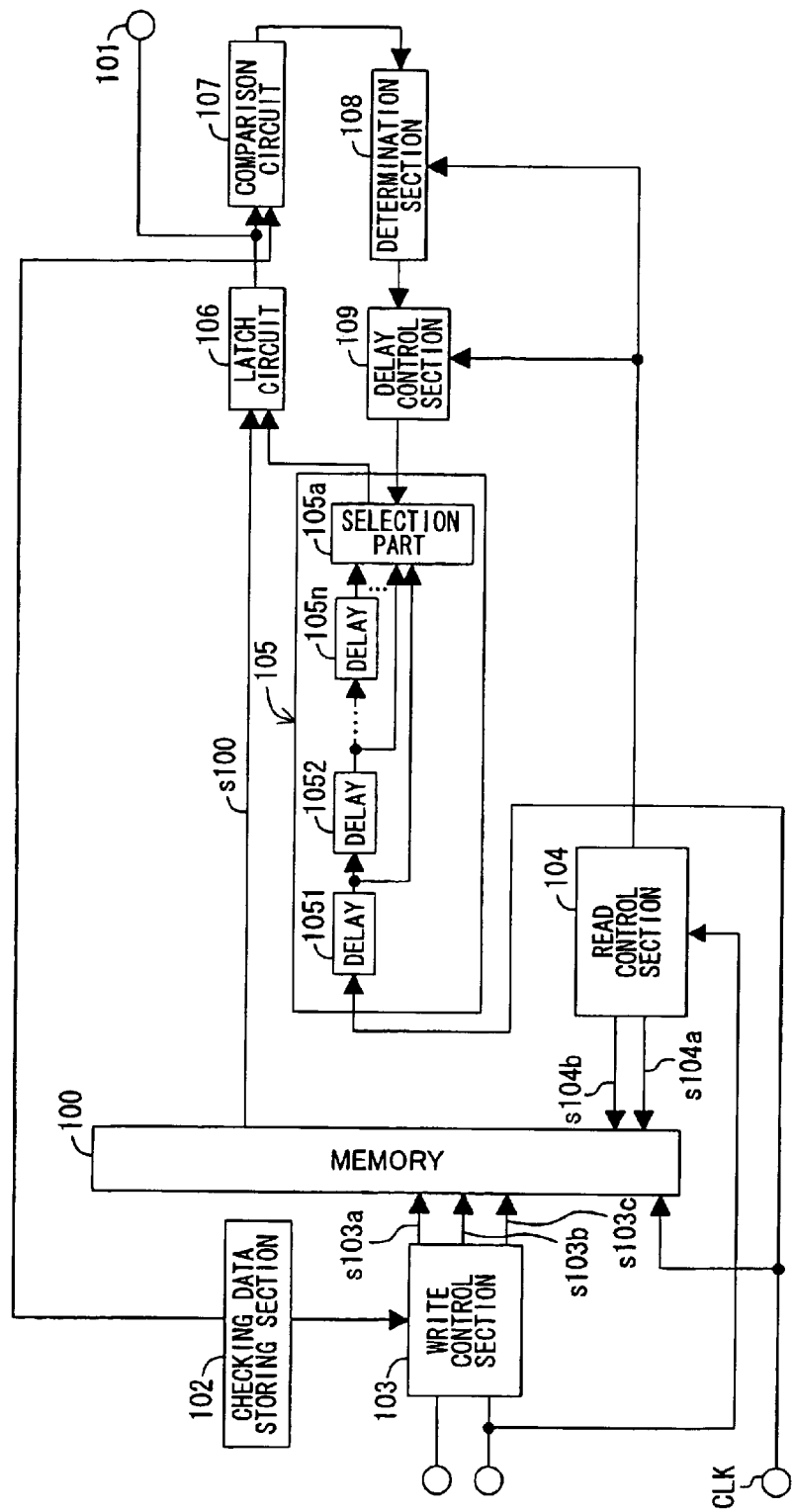
FIG. 4 is a block diagram showing a configuration of a data latch timing adjustment apparatus according to a second modified example of the first embodiment.

In FIG. 4, attention is given to the fact that the memory 100 operates in synchronization with the clock signal CLK, and the clock signal CLK is input to the delay selecting section 105 as a substitution of the latch pulse signal.

Accordingly, in this modified example, it is unnecessary for the read control section 104 to generate a latch pulse signal as in FIG. 1, so that the circuit configuration of the read control section 104 is simplified.

MODIFIED EXAMPLE 3 OF EMBODIMENT 1

Now, a third modified example of the first embodiment will be described with reference to FIG. 5. In this modified example, the memory 100 is a memory which outputs data and a strobe signal for taking the data.

Figure 5:
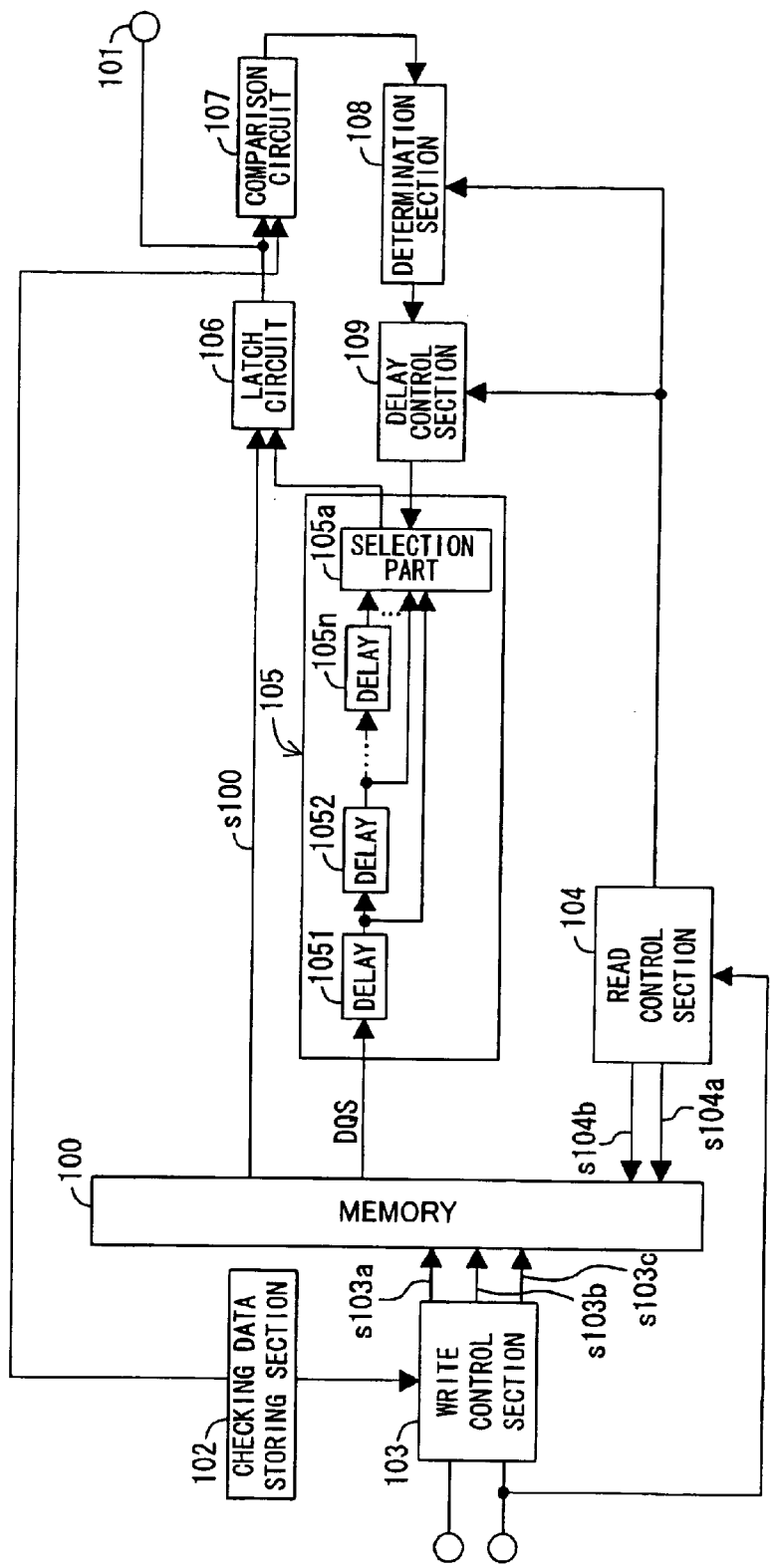
FIG. 5 is a block diagram showing a configuration of a data latch timing adjustment apparatus according to a third modified example of the first embodiment.

In FIG. 5, the memory 100 is configured to output one or more strobe signals (DQS signals) as well as data s100, so that the strobe signals are input to the delay selecting section 105 as latch pulse signals. If a plurality of strobe signals are provided and the readout data is 32 bits, one strobe signal corresponds to every 8 bits, so that four strobe signals are output in total.

Accordingly, in this modified example, it is also unnecessary for the read control section 104 to generate a latch pulse signal, so that the circuit configuration of the read control section 104 is simplified. In addition, a strobe signal is a signal for directing a timing of taking data, so that it is possible to limit the delay circuits provided in the delay selecting section 105 to a small number.

MODIFIED EXAMPLE 4 OF EMBODIMENT 1

Now, a fourth modified example of the first embodiment will be described with reference to FIG. 6. In this modified example, the readout data s100 from the memory 100 is n-bit data (where n is an integer of two or more).

Figure 6:
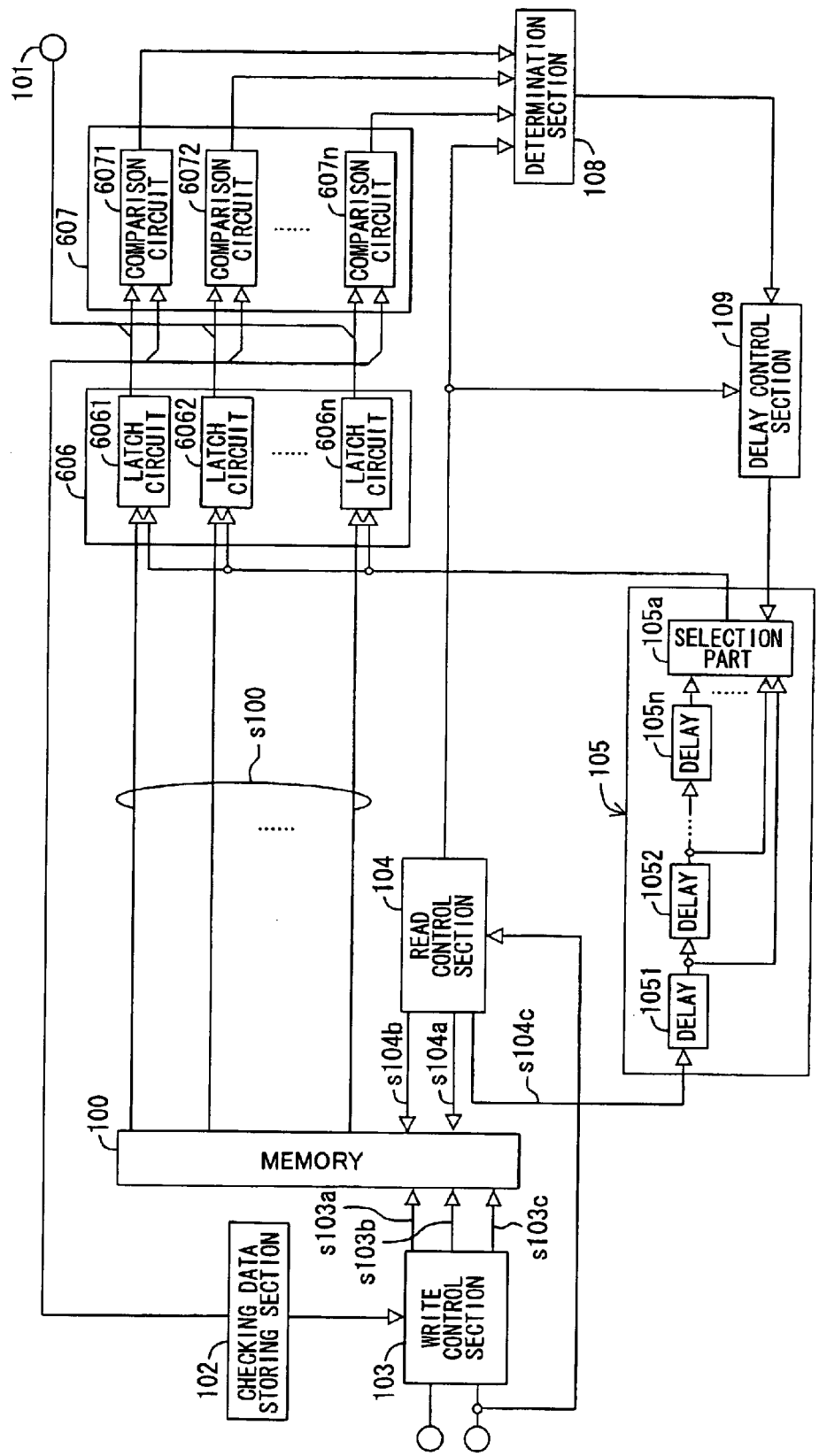
FIG. 6 is a block diagram showing a configuration of a data latch timing adjustment apparatus according to a fourth modified example of the first embodiment.

Specifically, in FIG. 6, in accordance with the memory 100 outputting the n-bit readout data s100, a latch section 606 is provided with n latch circuits 6061 through 606n and a comparison circuit 607 is provided with n comparison circuits 6071 through 607n. A checking data storing section 602 stores a plurality of n-bit checking data pieces corresponding to the n-bit readout data s100 beforehand. Each of the latch circuits 6061 through 606n receives an associated data bit of the n-bit readout data from the memory 100 and also receives a delayed pulse signal selected by the selection part 105a of the delay selecting section 105, thereby latching the associated data bit at a time of receiving the delayed pulse signal. In the delay selecting section 105, the selection part 105a selects the delayed pulse signal from the front delay circuit 1051 in reading out the first set of the n-bit data from the memory 100. Thereafter, in reading out each next set of the n-bit data from the memory 100, the selection part 105a selects a delayed pulse signal from a delay circuit at an associated next stage.

Each of the comparison circuits 6071 through 607n receives an associated data bit of an n-bit checking data piece for every checking data piece stored in the checking data storing section 102, and also receives latched data from an associated one of the n latch circuits 6061 through 606n, to compare these data items for detection of matching or mismatching therebetween.

The determination section 108 receives n comparison results from each of the n comparison circuits 6071 through 607n to determine a selection state of the selection part 105a in which all the n comparison results are "matching", i.e., to determine one of the delay circuit 1061 through 106n which outputs an optimum delayed pulse signal. The other configurations are the same as in the first embodiment and the description thereof will be herein omitted.

Accordingly, in this modified example, in a case where the readout data from the memory 100 is 3-bit (n=3) data, for example, a 3-bit data piece is latched using delayed pulse signals with the same delay, and the other 3-bit data pieces are repeatedly latched using delayed pulse signals whose delay amounts are sequentially increased set by set so that an optimum delayed pulse signal is selected from among delayed pulse signals with which all the 3-bit data pieces are normally latched.

MODIFIED EXAMPLE 5 OF EMBODIMENT 1

Figure 7:
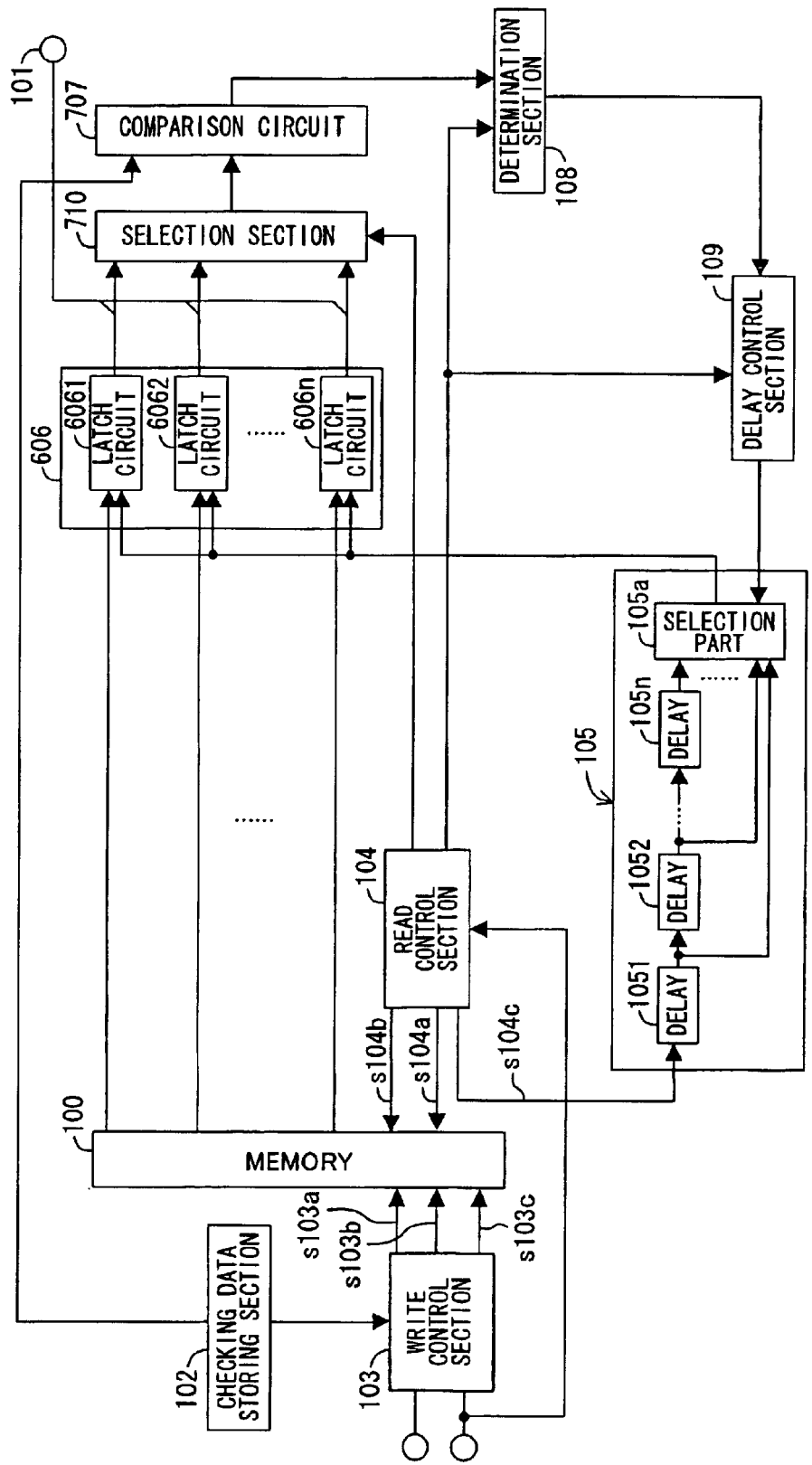
FIG. 7 is a block diagram showing a configuration of a data latch timing adjustment apparatus according to a fifth modified example of the first embodiment.

Now, a fifth modified example of the first embodiment will be described with reference to FIG. 7. This modified example is obtained by improving the fourth modified example shown in FIG. 6.

Specifically, the comparison section 607 is provided with n comparison circuits 6071 through 607n in FIG. 6, whereas only one comparison circuit 707 is provided and the comparison circuit 707 is shared among the n latch circuits 6061 through 606n in this modified example. A selection section 710 is placed at a previous stage of the comparison circuit 707. The selection section 710 is controlled by the read control section 104. When latch operations of the n latch circuits 6061 through 606n terminate, the selection section 710 selects one of the latch circuits 6061 through 606n one by one from the front thereof and outputs the latched data from the selected latch circuit to the comparison circuit 707.

Accordingly, in this modified example, an n-bit data piece is read out from the memory 100 and is latched by the n latch circuits 6061 through 606n, and then these latch circuits are sequentially selected one by one by the selection section 710 and the latched data is output to the comparison circuit 707. Then, the comparison circuit 707 compares each bit of the latched data and an associated checking data piece to detect matching or mismatching. When the comparison circuit 707 obtains comparison results with respect to all the bits of a data piece, the readout control section 104 outputs a timing signal s104a to the memory 100 such that the next n-bit data piece is read out from the memory 100.

In this modified example, though the selection section 710 is additionally provided, the number of the comparison circuits 707 is reduced from n to one, so that the circuit configuration is simplified.

Embodiment 2

Now, a data latch timing apparatus according to a second embodiment of the present invention will be described with reference to the drawings.

Figure 8:
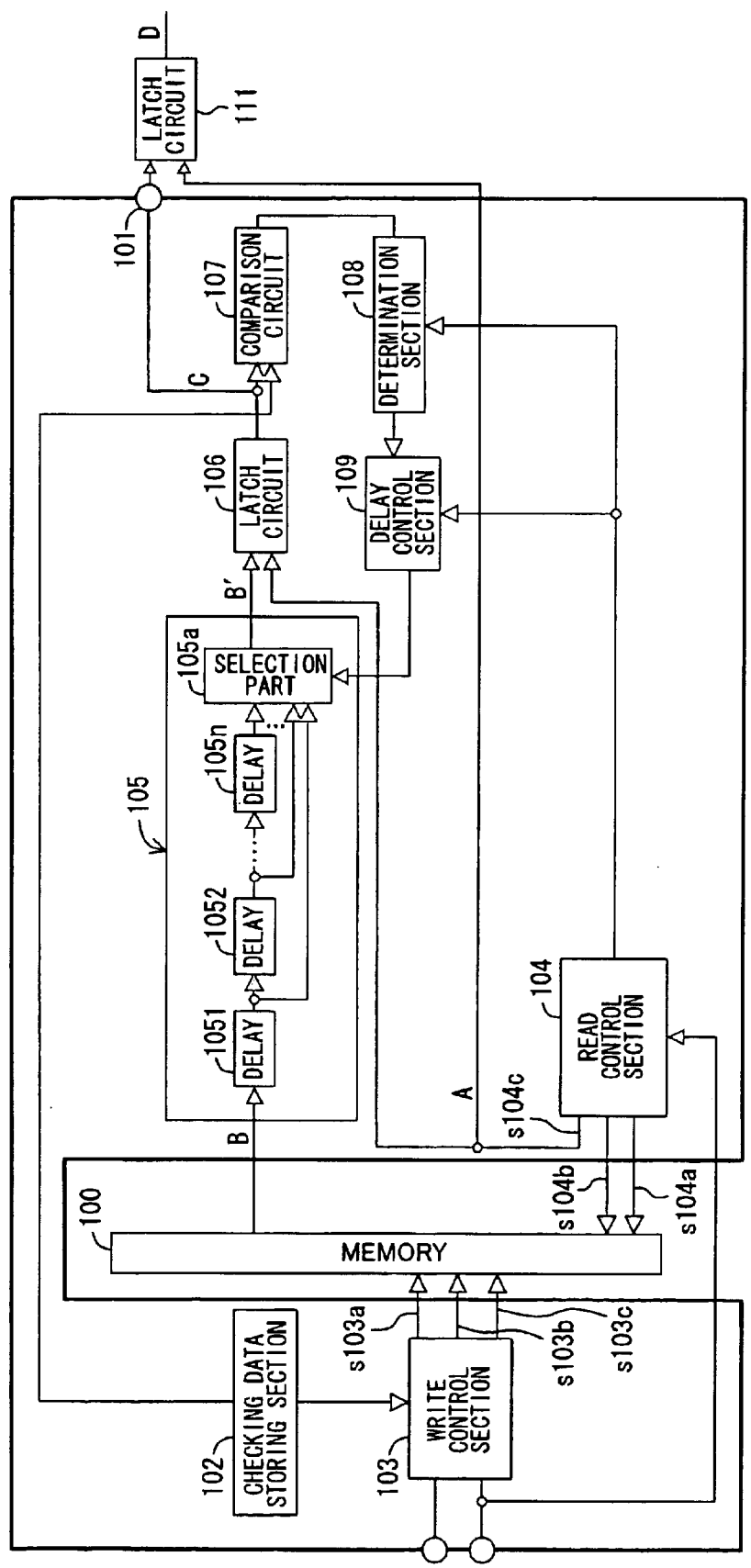
FIG. 8 is a block diagram showing a configuration of a data latch timing adjustment apparatus according to a second embodiment of the present invention.

FIG. 8 shows the data latch timing apparatus of the second embodiment. In this embodiment, the position of the delay selecting section 105 is changed.

Specifically, in FIG. 1 already described above, the delay selecting section 105 is placed on a path through which latch pulse signals from the read control section 104 are input to the latch circuit 106 so that delayed pulse signals with a plurality of delay amounts are generated. On the other hand, in this embodiment, the position of the delay selecting section 105 is moved to a path through which the readout data from the memory 100 is input to the latch circuit 106 so that the readout data is delayed with a plurality of delay amounts and a plurality of data outputs are generated. The other configurations are the same as in FIG. 1 and thus the description thereof will be herein omitted.

Accordingly, in this embodiment, the same effects as those in the first embodiment are obtained. In addition, in this embodiment, a latch pulse signal output from the read control section 104 is input to the latch circuit 106 without change, so that the latch timing at the latch circuit 106 does not change. Accordingly, the timing of outputting the readout data from the output terminal 101 does not change either. Therefore, this embodiment has another effect of easily designing a peripheral circuit for latching the readout data.

Although not shown, this embodiment shown in FIG. 8 may be of course modified in the same manner as shown in FIGS. 2, 4 and 5.

Figure 17:
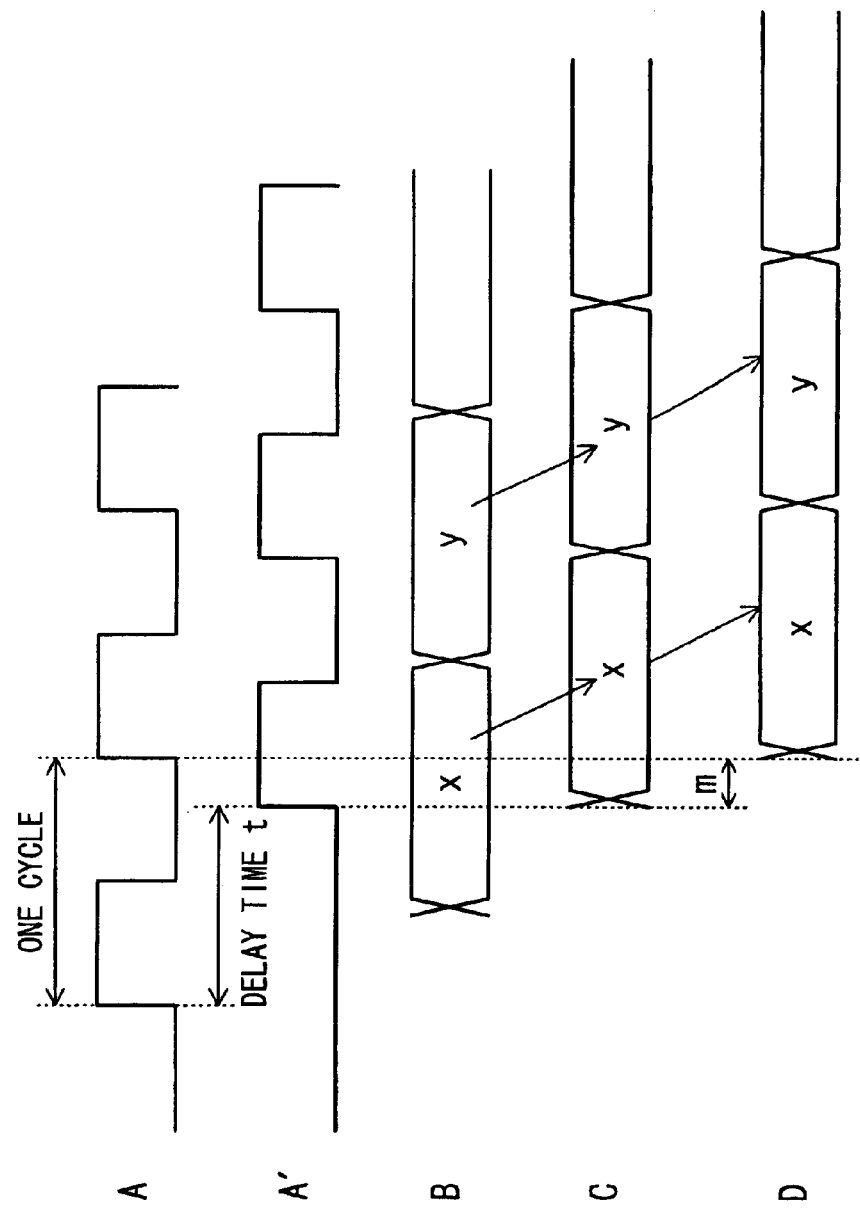
FIG. 17 is a diagram for explaining how the latch timing adjustment apparatus of the first embodiment operates.

The second embodiment shown in FIG. 8 is more advantageous than the first embodiment shown in FIG. 1 in the following aspect. That is to say, referring to FIG. 17, suppose the latch pulse signal s104c from the read control section 104 is A, a delayed latch pulse signal delayed at the delay selecting section 105 is A', data output from the memory 100 is B, data output from the latch circuit 106 inside the LSI is C and data output from the latch circuit 111 outside the LSI is D. Then, if the latch pulse signal A is delayed by a delay time (shown as character t in FIG. 17) close to one cycle of the signal so that the delayed latch pulse signal A' is generated, the data B (whose content is x) from the memory 100 is taken by the latch circuit 106 inside the LSI at a rising timing of the delayed latch pulse signal A'.

However, after the lapse of a very short time (shown as character m in FIG. 17), there comes a rising timing of the latch pulse signal A, and the data C (whose content is x) from the latch circuit 106 inside the LSI is taken by the latch circuit 111 outside the LSI at this rising timing. In this case, if the very short time m is less than a necessary margin for a data latch at the latch circuit 111 outside the LSI, the latch circuit 111 outside the LSI cannot take the correct data D (whose content is x).

Figure 18:
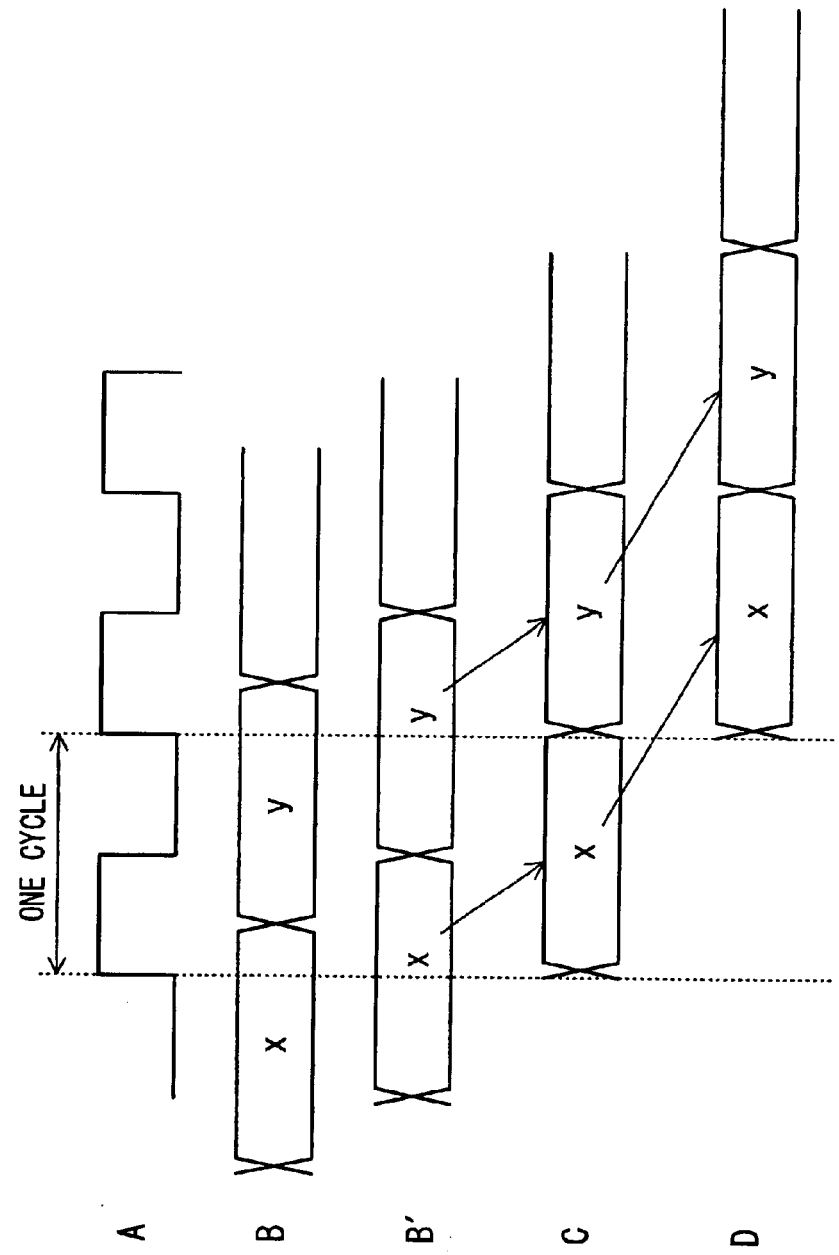
FIG. 18 is a diagram for explaining how the latch timing adjustment apparatus of the second embodiment operates.

On the other hand, in this embodiment, the configuration in which the data B from the memory 100 is delayed at the delay selecting section 105 to be the delay data B' ensures that the latch circuit 111 outside the LSI can take the correct data D (whose content is x) as shown in FIG. 18.

MODIFIED EXAMPLE 1 OF EMBODIMENT 2

Now, a first modified example of the second embodiment will be described with reference to FIG. 9. In this modified example, the readout data s100 from the memory 100 is n-bit data (n is an integer of two or more) as shown in FIG. 6.

Figure 9:
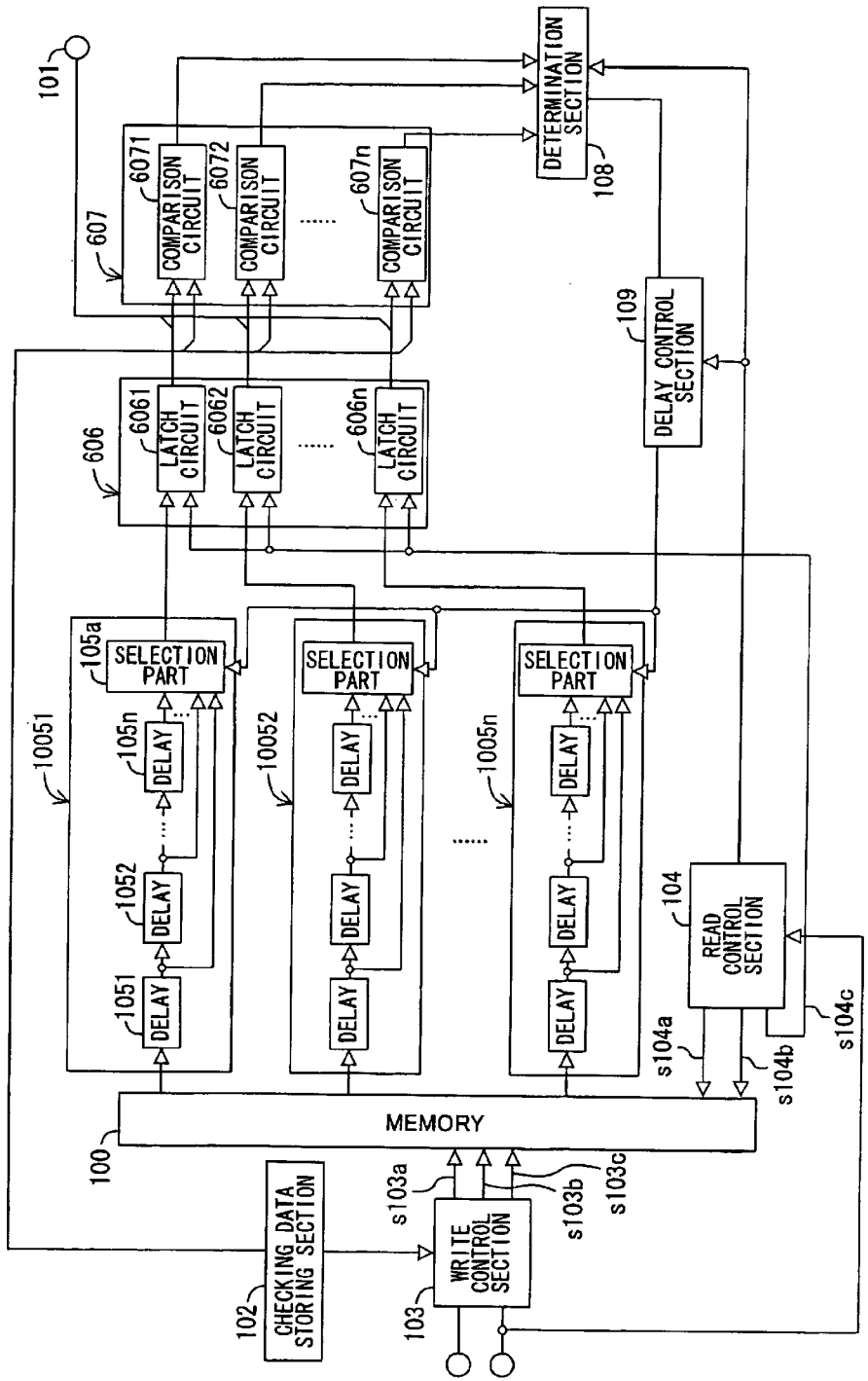
FIG. 9 is a block diagram showing a configuration of a data latch timing adjustment apparatus according to a first modified example of the second embodiment.

Specifically, in FIG. 9, a latch circuit 606 is provided with n latch circuits 6061 through 606n and a comparison section 607 is provided with n comparison circuits 6071 through 607n. In addition, the position of the delay selecting section 105 is moved to a path through which the readout data from the memory 100 is input to the latch circuit 106. Accordingly, n delay selecting sections 10051 through 1005n are arranged in a line for reading out the n-bit data from the memory 100.

The other configurations are the same as in FIG. 6 and the description thereof will be herein omitted.

MODIFIED EXAMPLE 2 OF EMBODIMENT 2

Figure 10:
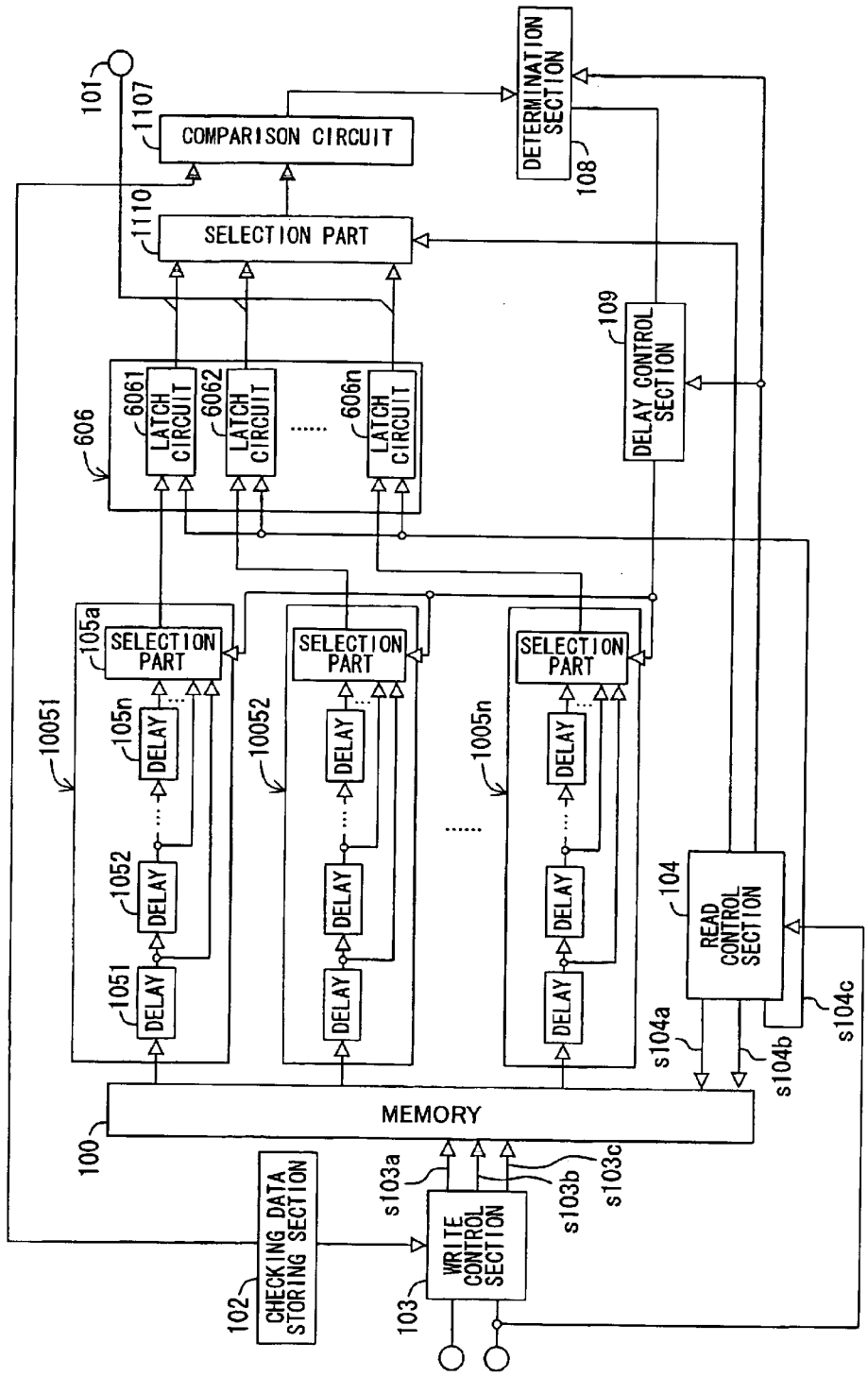
FIG. 10 is a block diagram showing a configuration of a data latch timing adjustment apparatus according to a second modified example of the second embodiment.

FIG. 10 shows a second modified example of the second embodiment. In this modified example, the number of n comparison circuits 6071 through 607n in the first modified example shown in FIG. 9 is reduced to one as shown in FIG. 7 described above.

Embodiment 3

Now, a third embodiment of the present invention will be described.

Figure 11:
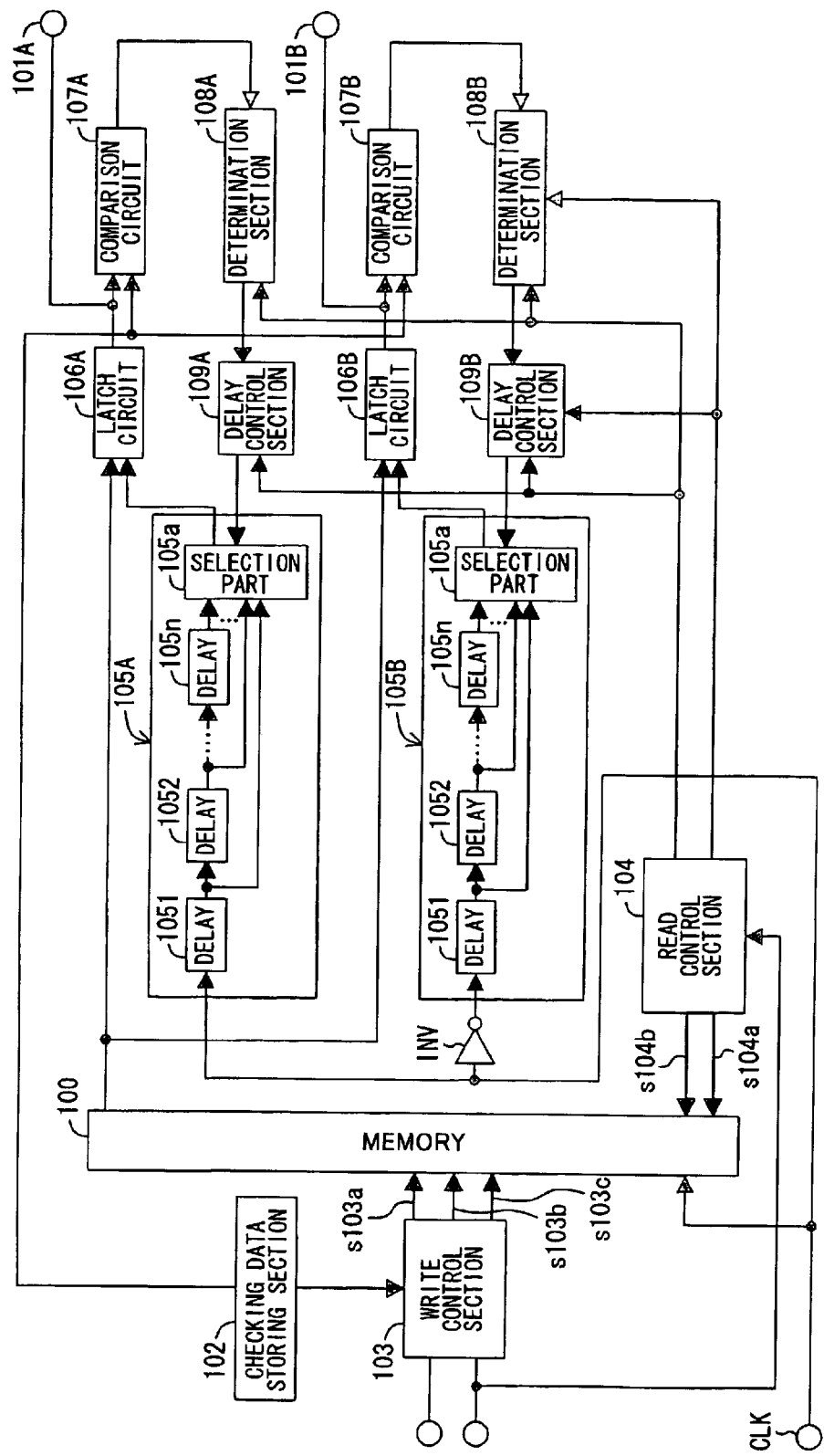
FIG. 11 is a block diagram showing a configuration of a data latch timing adjustment apparatus according to a third embodiment of the present invention.

FIG. 11 shows a data latch timing adjustment apparatus according to a third embodiment of the present invention. In this embodiment, a memory 100 is a double data rate (DDR)-SDRAM which operates in synchronization with both edges of a signal.

Specifically, in FIG. 11, the memory 100 receives a clock signal CLK and outputs data in synchronization with rising and falling edges of the clock signal CLK. Therefore, in this embodiment, two delay selecting sections 105A and 105B are provided so that the clock signal CLK is input to the delay selecting section 105A as a latch pulse signal without change whereas the clock signal CLK is inverted through an inverter INV and is also input to the other delay selecting section 105B. Accordingly, the delay selecting section 105A is for latching the readout data at the rising edge of the clock signal CLK and the other delay selecting section 105B is for latching the readout data at the falling edge of the clock signal CLK.

With respect to the delay selecting sections 105A and 105B, a latch circuit 106A, a comparison circuit 107A, a determination section 108A, a delay control section 109A and an output terminal 101A are provided in association with the delay selecting section 105A, whereas a latch circuit 106B, a comparison circuit 107B, a determination section 108B, a delay control section 109B and an output terminal 101B are provided in association with the delay selecting section 105B.

Accordingly, in this embodiment, the two delay selecting sections 105A and 105B are provided for use in reading data at both the rising and falling edges of the clock signal CLK. Therefore, it is possible to adjust latching of the readout data in synchronization with the rising edge of the clock signal CLK and latching of the readout data in synchronization with the falling edge thereof at optimum latch timings, using different delay selecting sections 105A and 105B, respectively. As a result, a latch timing adjustment can be performed with higher accuracy.

MODIFIED EXAMPLE 1 OF EMBODIMENT 3

Figure 12:
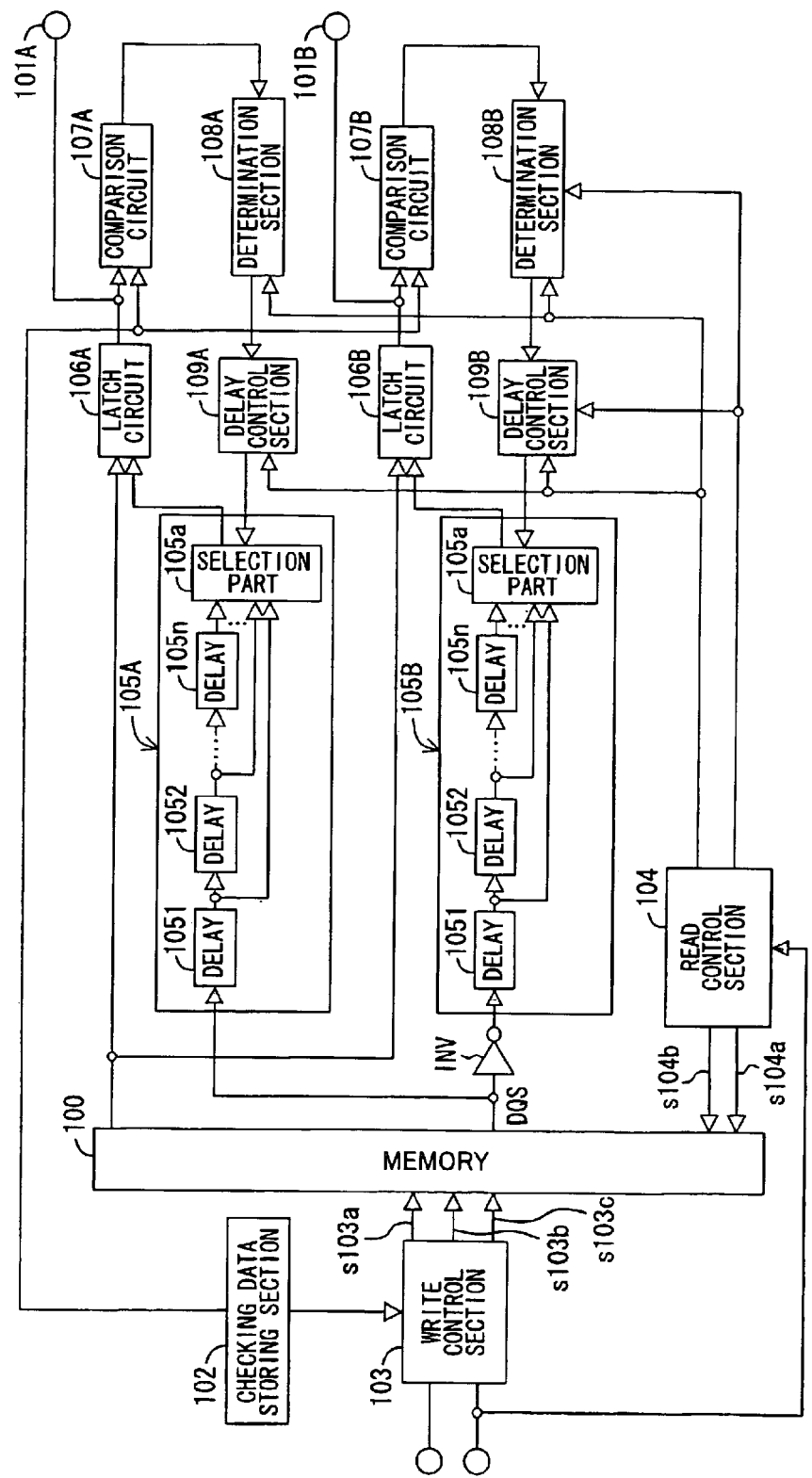
FIG. 12 is a block diagram showing a configuration of a data latch timing adjustment apparatus according to a first modified example of the third embodiment.

FIG. 12 shows a first modified example of the third embodiment in which the memory 100 is a memory which outputs data and a strobe signal.

Specifically, in FIG. 12, instead of the clock signal CLK, a strobe signal DQS from the memory 100 is directly input to the delay selecting section 105A as a latch pulse signal and the strobe signal DQS is also input, as a latch pulse signal, to the other delay selecting section 105B via the inverter INV. The other configurations are the same as in FIG. 11 and the description thereof will be herein omitted.

MODIFIED EXAMPLE 2 OF EMBODIMENT 3

Figure 13:
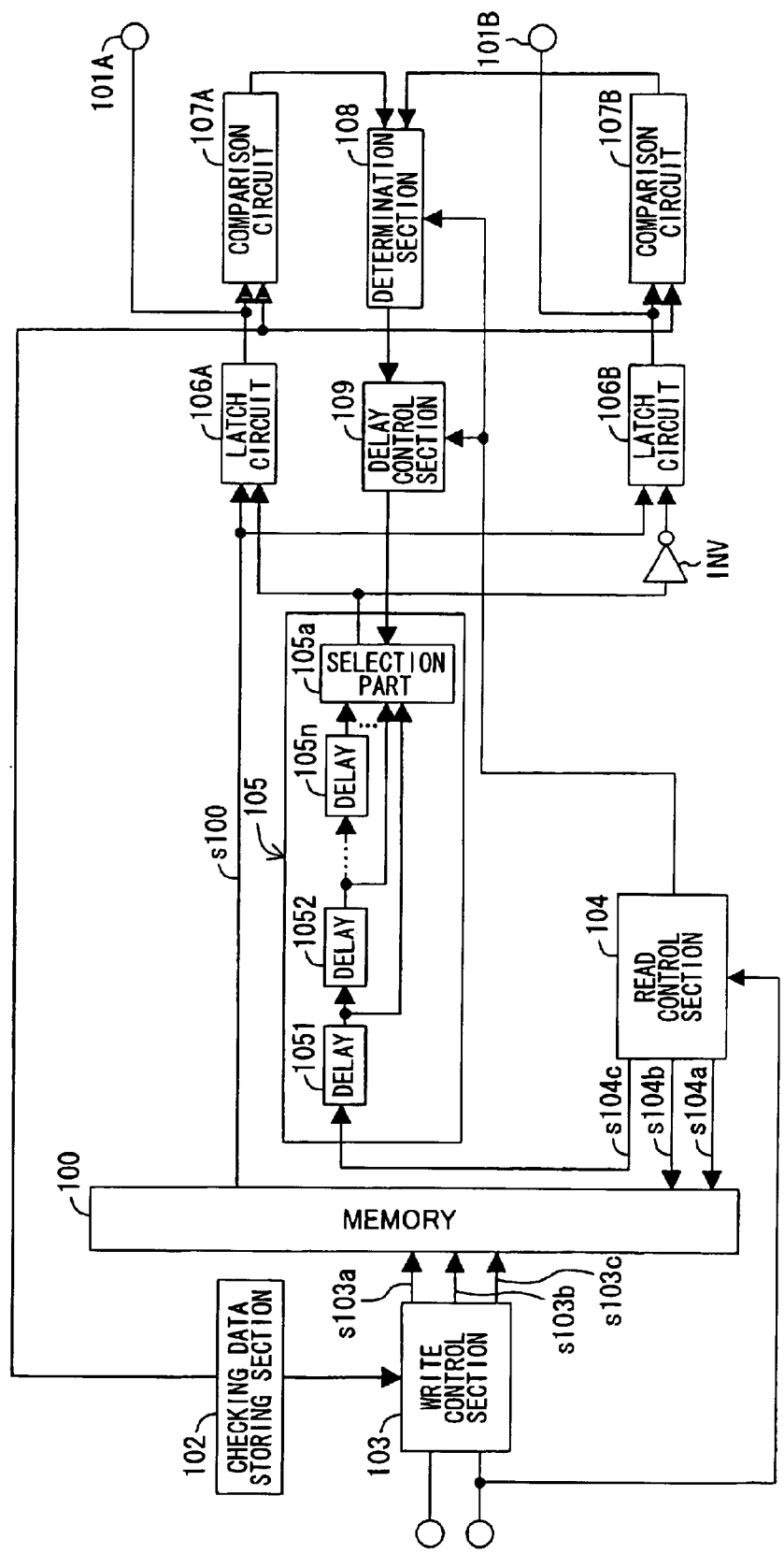
FIG. 13 is a block diagram showing a configuration of a data latch timing adjustment apparatus according to a second modified example of the third embodiment.

FIG. 13 shows a second modified example of the third embodiment. In this modified example, the third embodiment shown in FIG. 11 is further improved.

Specifically, though the two delay selecting sections 105A and 105B are provided in FIG. 11, only one delay selecting section 105 is provided in this modified example so that the output of the delay selecting section 105 is directly applied to the latch circuit 106A and the output thereof is also applied to the latch circuit 106B via the inverter INV. In FIG. 13, instead of the clock signal CLK, the read control section 104 outputs a latch pulse signal s104c to the delay selecting section 105.

Accordingly, in this modified example, though latching of the readout data in synchronization with the rising edge of the latch pulse signal s104c and latching of the readout data in synchronization with the falling edge thereof are adjusted at optimum latch timings, using the common delay selecting section 105, the delay selecting section 105, the determination section 108 and the delay control section 109 are commonly used in the manner as described above, so that the circuit configuration is simplified accordingly.

MODIFIED EXAMPLE 3 OF EMBODIMENT 3

Figure 14:
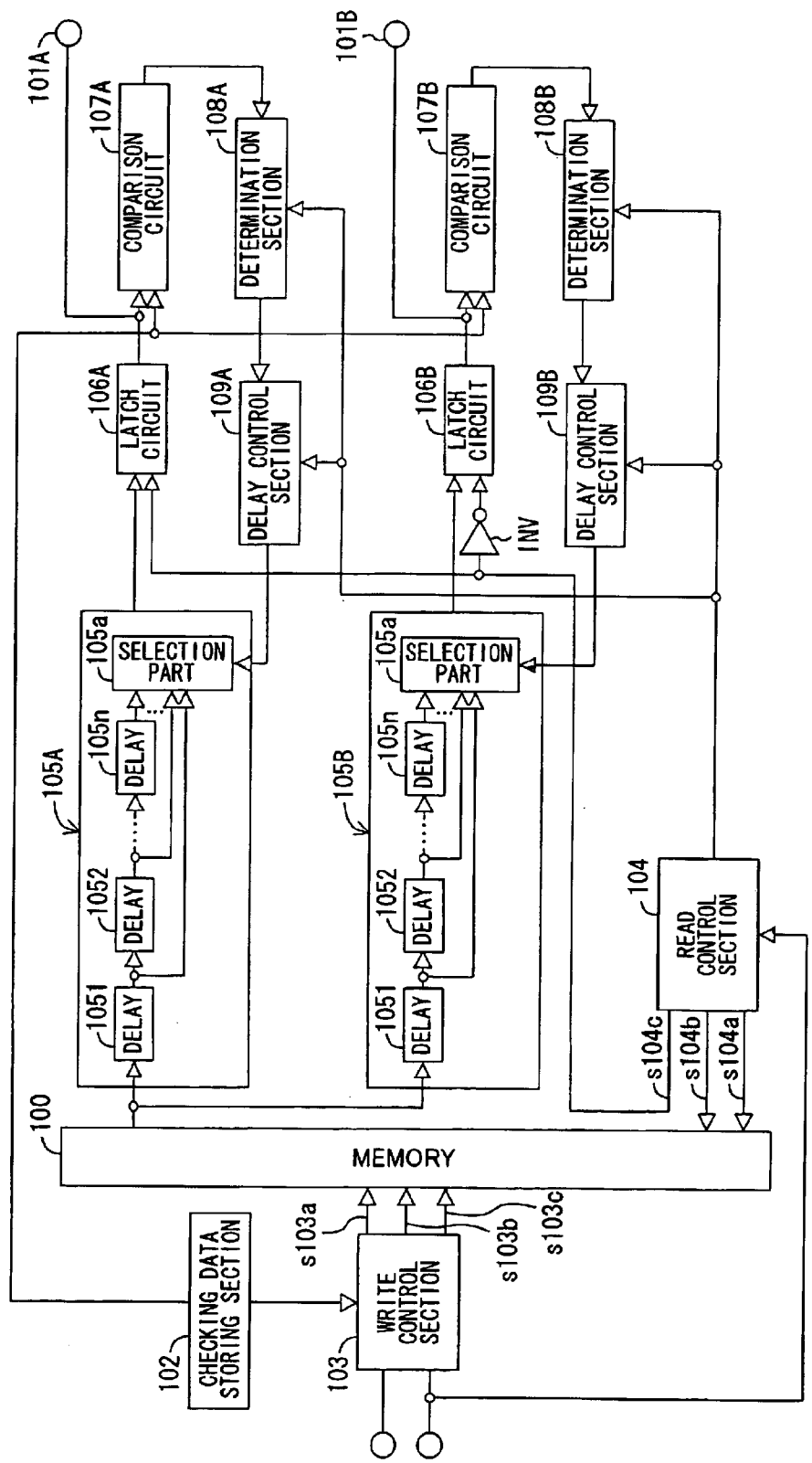
FIG. 14 is a block diagram showing a configuration of a data latch timing adjustment apparatus according to a third modified example of the third embodiment.

FIG. 14 shows a third modified example of the third embodiment. In this modified example, the position of the delay selecting section 105 is changed.

Specifically, in FIG. 14, two delay selecting sections 105A and 105B, two latch circuits 106A and 106B, two comparison circuits 107A and 107B, and two delay control sections 109A and 109B are provided on the assumption that the memory 100 operates in synchronization with both edges of a signal. The delay selecting section 105A is placed on a path through which readout data from the memory 100 is input to the latch circuit 106A. The other delay selecting section 105B is placed on a path through which readout data from the memory 100 is input to the other latch circuit 106B.

The readout control section 104 outputs a latch pulse signal s104c. The latch pulse signal s104c is directly input to the latch circuit 106A such that the data is latched at both the rising and falling edges thereof, and the latch pulse signal s104c is also input to the other latch circuit 106B via the inverter INV.

Accordingly, in this modified example, the same effects as in the third embodiment and the first modified example thereof are achieved.

MODIFIED EXAMPLE 4 OF EMBODIMENT 3

Figure 19:
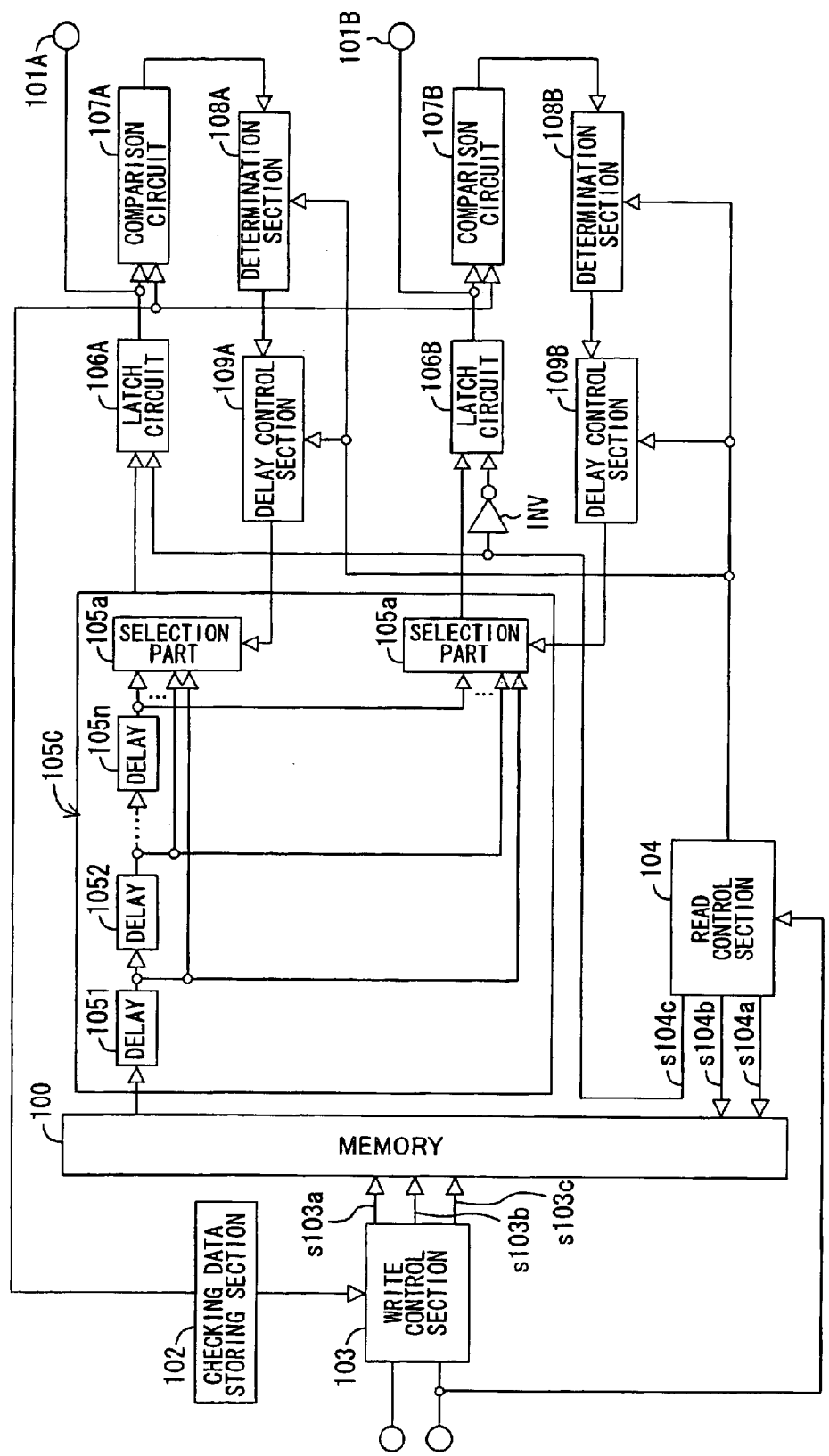
FIG. 19 is a block diagram showing a configuration of the latch timing adjustment apparatus according to a fourth modified example of the third embodiment.

FIG. 19 shows a fourth modified example of the third embodiment. In this modified example, the delay selecting sections 105A and 105B shown in FIG. 14 are modified.

Specifically, in the third modified example shown in FIG. 14, the two delay selecting sections 105A and 105B are provided. On the other hand, in this modified example, only one delay selecting section 105C is provided so that the delay circuits 1051 through 105n, which are provided in two sets for the respective delay selecting sections 105A and 105B in FIG. 14, are provided in one set in the delay selecting section 105C. The two selecting parts 105a are provided as in FIG. 14.

Accordingly, in this modified example, the other set of delay circuits 1051 through 105n is not needed so that the circuit configuration is simplified and the cost thereof becomes low.

Embodiment 4

Now, a fourth embodiment of the present invention will be described with reference to FIG. 15. This embodiment is applied to data passing between two LSIs, whereas data is passed between a memory and a memory control circuit (LSI) in the foregoing description.

Figure 15:
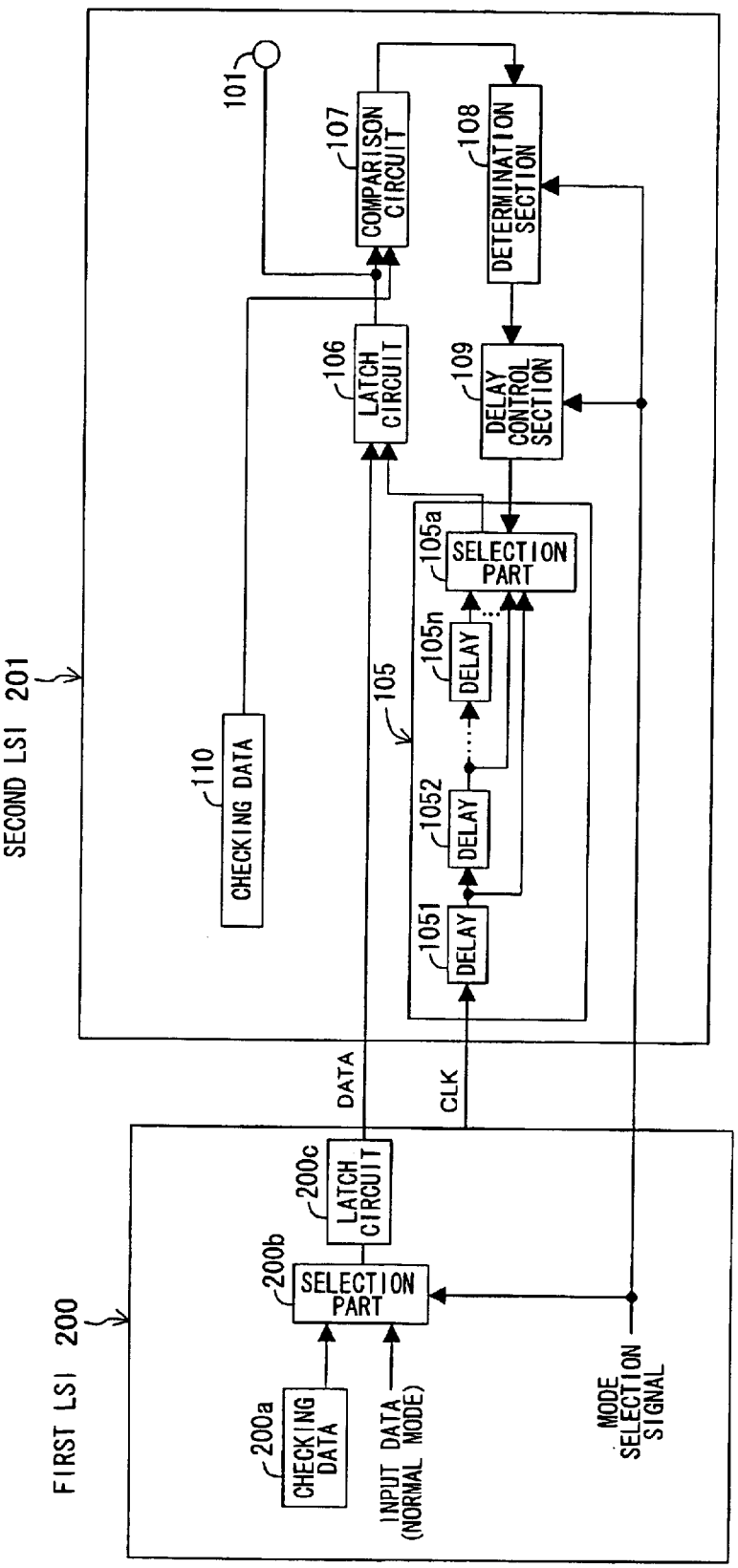
FIG. 15 is a block diagram showing a configuration of a data latch timing adjustment apparatus according to a fourth embodiment of the present invention.
Figure 16:
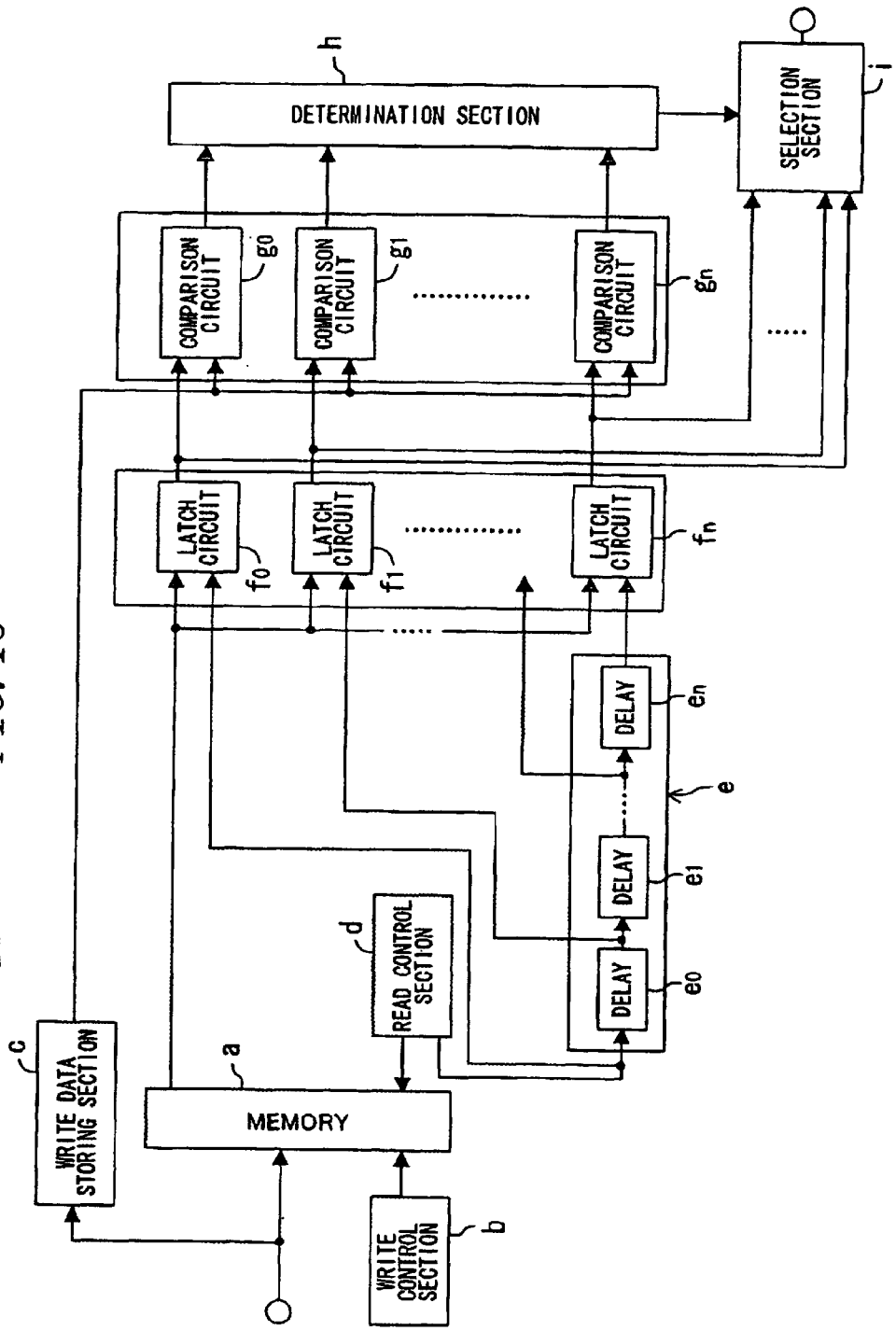
FIG. 16 is a block diagram showing a configuration of a known data latch timing adjustment apparatus.

Specifically, in FIG. 15, reference numeral 200 denotes a first LSI and reference numeral 201 denotes a second LSI. The first LSI 200 stores beforehand checking data pieces 200a for use in a latch timing adjustment of data, and includes a selection section 200b and a latch circuit 200c. The selection section 200b receives a mode selection signal to select data which is normally input in normal operation if the mode selection signal directs a normal operation mode, and to select the checking data pieces 200a if the mode selection signal directs a latch timing adjustment. The latch circuit 200c latches the data selected by the selection section 200b and outputs the latched data to the second LSI 201. The first LSI 200 outputs a clock signal CLK to the second LSI 201 together with the data latched by the latch circuit 200c.

The second LSI 201 includes: a delay selecting section 105; a latch circuit 106; a comparison circuit 107; a determination section 108; and a delay control section 109, as already described with reference to FIG. 1. In addition, checking data pieces 110 for a latch timing adjustment which is the same as the checking data pieces 200a for adjusting latch timing held in the first LSI 200 are held in the second LSI 201 beforehand. In the second LSI 201, the clock signal CLK from the first LSI 200 is input to the delay selecting section 105. The latch circuit 106 in the second LSI 201 receives data from the first LSI 200 and also receives a delayed pulse signal selected by a selection part 105a of the delay selecting section 105 to latch the data from the first LSI 200 at a time of receiving the delayed pulse signal. In a latch timing adjustment mode, the comparison circuit 107 receives the latched data from the latch circuit 106 and one of the inside checking data pieces 110 associated with the latched data, to repeatedly compare these data items for determination whether they match or not. The determination circuit 108 receives the mode selection signal and, in the latch timing adjustment mode, determines multiple comparison results after the comparisons have been terminated, so that the delay selecting section 105 selects an optimum delay circuit. The delay control section 109 receives the mode selection signal and, during the latch timing adjustment mode, selects the delay circuits one by one in order from the front delay circuit 1051 as described above, and when the latch timing adjustment terminates, controls the selection part 105a in accordance with the determination result of the determination section 108 so that the selection part 105a selects the delay circuit determined by the determination section 108.

The first and second LSIs 200 and 201 hold the respective checking data pieces 200a and 110 beforehand so that the termination of the latch timing adjustment mode is recognized by determining termination of repetition of the comparisons at the comparison circuit 107. Accordingly the delay determination signal as described in the first embodiment shown in FIG. 1 is unnecessary.

Therefore, in the data passing between the two LSIs 200 and 201 of this embodiment, provision of the delay selecting section 105 in the LSI 201 at the reception side allows a latch timing adjustment of data to be performed automatically by providing only one latch circuit 106 and one comparison circuit 107.

In this embodiment, data is latched by the latch circuit 106 at a rising edge of a delayed pulse signal output from the delay selecting section 105. Alternatively, the data may be of course latched at both the rising and falling edges of the delay pulse. In addition, the clock signal CLK is input to the delay selecting section 105 as a latch pulse signal. Instead of the clock signal CLK, data from the first LSI 200 may be input to the delay selecting section 105 for generation of a delayed pulse signal. Moreover, the data from the first LSI 200 may be n-bit data. In such cases, the foregoing embodiments and modified examples are applicable in the same manner. Moreover, the determination method described above is applicable to the determination method of the determination section 108 in the same manner.

Embodiment 5

Now, a fifth embodiment of the present invention will be described. In the foregoing description, the n delay circuits 1051 through 105n are selected one by one in order from the front thereof in the delay selecting section 105. In this embodiment, this selection order is changed. In this embodiment, an example in which a delay selecting section 105 is provided with eight delay circuits 1051 through 1058 as shown in FIG. 20 will be described.

Figure 20:
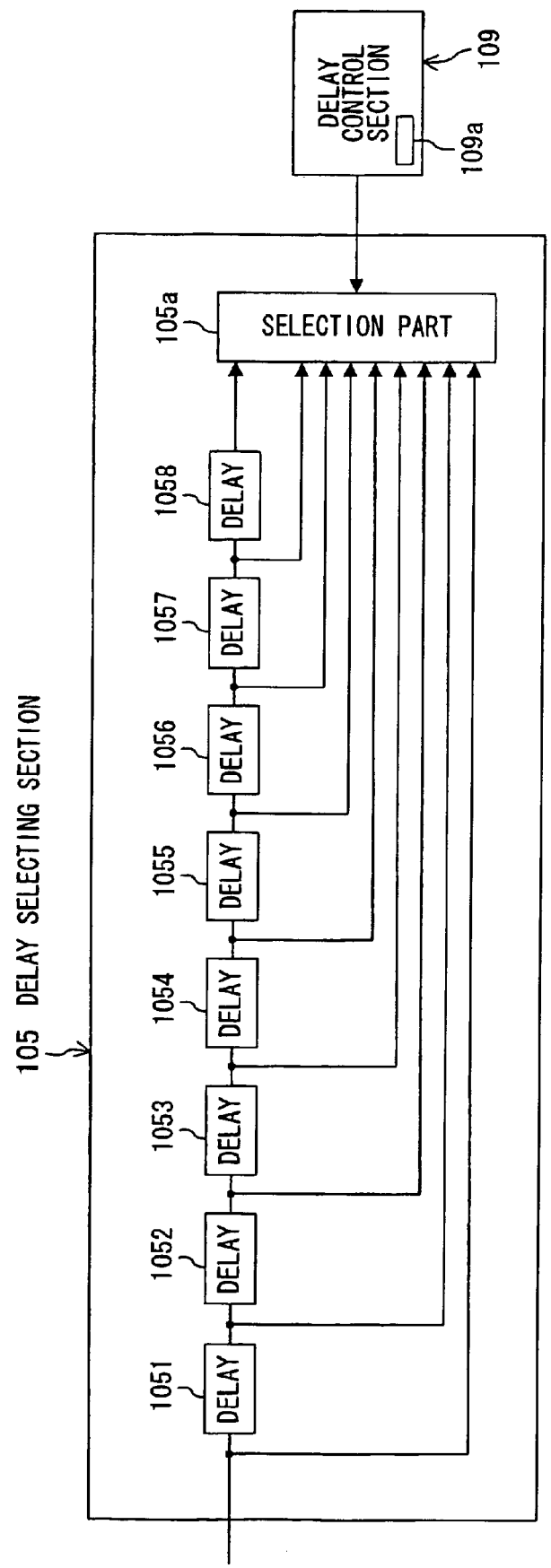
FIG. 20 is a block diagram showing a configuration of a delay selecting section provided in a latch timing adjustment apparatus according to a fifth embodiment of the present invention.

In FIG. 20, a delay control section 109 includes a storage circuit 109a. The storage circuit 109a stores one delay circuit selected by a selection part 105a at a preceding latch timing adjustment. At the next latch timing adjustment, the delay control section 109 controls the selection part 105a such that the selection part 105a sequentially selects delay circuits located at the front and back of an already selected delay circuit (e.g., delay circuit 1054) according to the content stored in the storage circuit 109a. Specifically, with reference to the delay circuit 1054, for example, the delay circuit 1055 is selected first, and the delay circuit 1053 is selected next, and then the delay circuit 1056, the delay circuit 1052, the delay circuit 1057 and the delay circuit 1051 are selected in this order.

In this case, the number of delay circuits to be sequentially selected is limited. For example, the sequential selection of delay circuits may be terminated when the number of appropriate latchings of the data s100 from the memory 100 reaches a given number. For example, if the selection is terminated when five delay circuits are selected, no other circuits are selected after the delay circuits 1054, 1055, 1053, 1056 and 1052 have been selected in the above example.

Accordingly, in this embodiment, it is unnecessary to select all the delay circuits in the delay selecting section 105 in order. As a result, a latch timing adjustment is completed in a short time.

MODIFIED EXAMPLE OF EMBODIMENT 5

Now, a modified example of the fifth embodiment of the present invention will be described. In this modified example, description is also given using the delay selecting section 105 shown in FIG. 20.

In this modified example, the eight delay circuits are selected in the following order. First, i.e., immediately after the power has been turned ON, all the delay circuits 1051 through 1058 provided in the delay selecting section 105 are selected in order, and latch timing is adjusted, thereby selecting one delay circuit.

The following operation is repeated at every subsequent latch timing adjustment, e.g., every after a lapse of a given time. That is to say, first, some of the delay circuits 1051 through 1058 provided in the delay selecting section 105 are selected in order, and delay circuits among delay circuits which have allowed the data to be appropriately latched are determined to be a target of the next selection. Next, the delay circuits as the selection target are selected in order, so that one delay circuit is determined finally. For example, first, four odd-numbered delay circuits 1051, 1053, 1055 and 1057 are selected in order. If the delay circuits which have allowed the data to be appropriately latched are the two delay circuits 1053 and 1055, the delay circuit 1054 located between these delay circuits 1053 and 1055 is selected. If the delay circuit 1054 has also allowed the data to be latched appropriately, the delay circuit 1054 located at the center of these three delay circuit 1053 though 1055 is finally selected as an optimum delay circuit.

Accordingly, in this modified example, it is also unnecessary to select all the delay circuits in the delay selecting section 105 in order. As a result, a latch timing adjustment is completed in a short time.

What is claimed is:

1. A data latch timing adjustment apparatus for adjusting latch timing of output data, the apparatus comprising:

a delay selecting section for delaying the output data with a plurality of delay amounts, generating a plurality of delayed output data pieces, and selecting and outputting one of the delayed output data pieces;

a latch circuit for receiving the delayed output data piece selected by the delay selecting section and a latch pulse signal, and latching the delayed output data piece at a time of receiving the latch pulse signal;

a delay control section for controlling the delay selecting section such that one of the delayed output data pieces with a delay amount different from that of the preceding delayed output data piece is selected by the delay selecting section and the current delayed output data piece is input to the latch circuit every time the latch pulse signal is input to the latch circuit;

a comparison circuit for comparing the data piece latched by the latch circuit with an associated checking data piece to determine whether or not the latched data piece and the checking data piece match each other; and a determination section for receiving a plurality of comparison results from the comparison circuit, and determining, based on the comparison results, a delay amount in the delay selecting section with which the latch circuit latches the data piece appropriately.

2. The data latch timing adjustment apparatus of claim 1, wherein when the comparison results at the comparison circuit include successive matching results, the determination section determines that a delay amount located at the center of a plurality of delay amounts in the delay selecting section associated with the successive matching results is an appropriate delay amount.

3. The data latch timing adjustment apparatus of claim 1, wherein when the comparison results at the comparison circuit include successive matching results, the determination section determines that the smallest one of a plurality of delay amounts in the delay selecting section associated with the successive matching results is an appropriate delay amount.

4. The data latch timing adjustment apparatus of claim 1, wherein when the comparison results at the comparison circuit include successive matching results, the determination section determines that a delay amount shifted in consideration of a tendency in variation of an ambient temperature from a delay amount located at the center of a plurality of delay amounts in the delay selecting section associated with the successive matching results is an appropriate delay amount.

5. The data latch timing adjustment apparatus of claim 1, wherein the determination section considers all the comparison results at the comparison circuit and determines that a delay amount in the delay selecting section associated with one of the comparison results having a high probability of being selected is an appropriate delay amount.

6. The data latch timing adjustment apparatus of claim 1, wherein the output data is data of n (n is an integer of two or more) bits, and the latch circuit and the comparison circuit are respectively provided n in number.

7. The data latch timing adjustment apparatus of claim 1, wherein the output data is data of n (n is an integer of two or more) bits, the latch circuit is provided n in number, the comparison circuit is provided singular in number, and a selection section for selecting one of the n latch circuits is placed between the n latch circuits and the comparison circuit.

8. The data latch timing adjustment apparatus of claim 1, wherein the latch circuit latches the output data at rising and falling edges of the latch pulse signal, and the delay selecting section, the latch circuit and the comparison circuit are provided in two sets such that one of the two sets is for a rising edge of the latch pulse signal and the other set is for a falling edge thereof.

9. The data latch timing adjustment apparatus of claim 8, wherein the output data is data read out from a memory which outputs a strobe signal as well as the data, and the latch pulse signal is substituted by the strobe signal output from the memory.

10. The data latch timing adjustment apparatus of claim 1, wherein the latch circuit latches the output data at rising and falling edges of the latch pulse signal, the latch circuit and the comparison circuit are provided in two sets such that one of the two sets is for a rising edge of the latch pulse signal and the other set is for a falling edge thereof, the delay selecting section is provided singular in number, and the delayed output data piece selected by the delay selecting section and a reverse signal of the delayed output data piece are input to the latch circuit for the rising edge and to the latch circuit for the falling edge, respectively.

11. The data latch timing adjustment apparatus of claim 10, wherein the latch pulse signal is input to the delay selecting section.

12. The data latch timing adjustment apparatus of claim 10, wherein the output data is input to the delay selecting section.

13. The data latch timing adjustment apparatus of claim 1, wherein the output data is data read out from a memory,
the checking data piece is stored in a checking data storing section beforehand, and
in reading the output data from the memory, the checking data piece stored in the checking data storing section is written into the memory prior to the readout of the output data, and then the checking data piece is read out as the output data from the memory.

14. The data latch timing adjustment apparatus of claim 13, wherein the checking data piece is stored in the checking data storing section in a pattern in which a crosstalk between adjacent bits in the memory is taken into consideration.

15. The data latch timing adjustment apparatus of claim 2, wherein after the determination section has determined the appropriate delay amount in the delay selecting section, the delay control section controls the delay selecting section such that delay amounts are sequentially increased or decreased relative to the appropriate delay amount in subsequent latch timing adjustments.

16. The data latch timing adjustment apparatus of claim 15, wherein in increasing or decreasing the delay amounts sequentially relative to the appropriate delay amount, the delay control section limits the increase or decrease of the delay amounts within a given range.

17. The data latch timing adjustment apparatus of claim 2, wherein the delay control section sequentially selects part of a plurality of delay amounts in the delay selecting section and determines that a range of delay amounts located among some of the part of the delay amounts with which the data piece is appropriately latched is a target of a next selection, and
in the next selection, the delay control section sequentially selects delay amounts included in the range of delay amounts which is the target of the selection to finally determine the appropriate delay amount based on one or more delay amounts with which the data piece is appropriately latched.

18. A data latch timing adjustment apparatus for adjusting latch timing of output data, the apparatus comprising:
a delay selecting section for delaying the output data with a plurality of delay amounts, generating a plurality of delayed output data pieces, and selecting and outputting one of the delayed output data pieces;
a latch circuit for receiving the delayed output data piece selected by the delay selecting section and a latch pulse signal, and latching the delayed output data piece at a time of receiving the latch pulse signal; and
a delay control section for controlling the delay selecting section such that one of the delayed output data pieces with a delay amount different from that of the preceding delayed output data piece is selected by the delay selecting section and the current delayed output data piece is input to the latch circuit every time the latch pulse signal is input to the latch circuit,
wherein the output data is data read out from a memory,
the latch circuit is provided in an LSI which receives the data read out from the memory,
the memory is a memory which outputs a strobe signal as well as the data, and
the latch pulse signal to be input to the delay selecting section is substituted by the strobe signal output from the memory.

19. A data latch timing adjustment apparatus for adjusting latch timing of output data, the apparatus comprising:
a delay selecting section for receiving a latch pulse signal, delaying the latch pulse signal with a plurality of delay amounts, generating a plurality of delayed latch pulse signals, and selecting and outputting one of the delayed latch pulse signals;
a latch circuit for receiving the output data and the delayed latch pulse signal selected by the delay selecting section, and latching the output data at a time of receiving the delayed latch pulse signal;
a delay control section for controlling the delay selecting section such that one of the delayed latch pulse signals with a delay amount different from that of the preceding delayed latch pulse signal is selected by the delay selecting section and the current delayed latch pulse signal is input to the latch circuit every time the delayed latch pulse signal is input to the latch circuit;
a comparison circuit for comparing the output data latched by the latch circuit with an associated checking output data to determine whether or not the latched data piece and the checking data piece match each other; and
a determination section for receiving a plurality of comparison results from the comparison circuit, and determining, based on the comparison results, a delay amount in the delay selecting section with which the latch circuit latches the output data appropriately.

20. The data latch timing adjustment apparatus of claim 19, wherein when the comparison results at the comparison circuit include successive matching results, the determination section determines that a delay amount located at the center of a plurality of delay amounts in the delay selecting section associated with the successive matching results is an appropriate delay amount.

21. The data latch timing adjustment apparatus of claim 19, wherein when the comparison results at the comparison circuit include successive matching results, the determination section determines that the smallest one of a plurality of delay amounts in the delay selecting section associated with the successive matching results is an appropriate delay amount.

22. The data latch timing adjustment apparatus of claim 19, wherein when the comparison results at the comparison circuit include successive matching results, the determination section determines that a delay amount shifted in consideration of a tendency in variation of an ambient temperature from a delay amount located at the center of a plurality of delay amounts in the delay selecting section associated with the successive matching results is an appropriate delay amount.

23. The data latch timing adjustment apparatus of claim 19, wherein the determination section considers all the comparison results at the comparison circuit and determines that a delay amount in the delay selecting section associated with one of the comparison results having a high probability of being selected is an appropriate delay amount.

24. The data latch timing adjustment apparatus of claim 19, wherein the output data is data of n (n is an integer of two or more) bits, and
the latch circuit and the comparison circuit are respectively provided n in number.

25. The data latch timing adjustment apparatus of claim 19, wherein the output data is data of n (n is an integer of two or more) bits, the latch circuit is provided n in number, the comparison circuit is provided singular in number, and a selection section for selecting one of the n latch circuits is placed between the n latch circuits and the comparison circuit.

26. The data latch timing adjustment apparatus of claim 19, wherein the latch circuit latches the output data at rising and falling edges of the delayed latch pulse signal selected by the delay selecting section, and the delay selecting section, the latch circuit and the comparison circuit are provided in two sets such that one of the two sets is for a rising edge of the delayed latch pulse signal and the other set is for a falling edge of the delayed latch pulse signal.

27. The data latch timing adjustment apparatus of claim 26, wherein the output data is data read out from a memory which outputs a strobe signal as well as the data, and the latch pulse signal is substituted by the strobe signal output from the memory.

28. The data latch timing adjustment apparatus of claim 19, wherein the latch circuit latches the output data at rising and falling edges of the delayed latch pulse signal selected by the delay selecting section, the latch circuit and the comparison circuit are provided in two sets such that one of the two sets is for a rising edge of the delayed latch pulse signal and the other set is for a falling edge of the delayed latch pulse signal, the delay selecting section is provided singular in number, and the delayed latch pulse signal selected by the delay selecting section and a reverse signal of the delayed latch pulse signal are input to the latch circuit for the rising edge and to the latch circuit for the falling edge, respectively.

29. The data latch timing adjustment apparatus of claim 28, wherein the latch pulse signal is input to the delay selecting section.

30. The data latch timing adjustment apparatus of claim 28, wherein the output data is input to the delay selecting section.

31. The data latch timing adjustment apparatus of claim 19, wherein the output data is data read out from a memory, the checking data piece is stored in a checking data storing section beforehand, and in reading the output data from the memory, the checking data piece stored in the checking data storing section is written into the memory prior to the readout of the output data, and then the checking data piece is read out as the output data from the memory.

32. The data latch timing adjustment apparatus of claim 31, wherein the checking data piece is stored in the checking data storing section in a pattern in which a crosstalk between adjacent bits in the memory is taken into consideration.

33. The data latch timing adjustment apparatus of claim 20, wherein after the determination section has determined the appropriate delay amount in the delay selecting section, the delay control section controls the delay selecting section such that delay amounts are sequentially increased or decreased relative to the appropriate delay amount in subsequent latch timing adjustments.

34. The data latch timing adjustment apparatus of claim 33, wherein in increasing or decreasing the delay amounts sequentially relative to the appropriate delay amount, the delay control section limits the increase or decrease of the delay amounts within a given range.

35. The data latch timing adjustment apparatus of claim 20, wherein the delay control section sequentially selects part of a plurality of delay amounts in the delay selecting section and determines that a range of delay amounts located among some of the part of the delay amounts with which the output data is appropriately latched is a target of a next selection, and in the next selection, the delay control section sequentially selects delay amounts included in the range of delay amounts which is the target of the selection to finally determine the appropriate delay amount based on one or more delay amounts with which the output data is appropriately latched.

36. A data latch timing adjustment apparatus for adjusting latch timing of output data, the apparatus comprising:

a delay selecting section for receiving a latch pulse signal, delaying the latch pulse signal with a plurality of delay amounts, generating a plurality of delayed latch pulse signals, and selecting and outputting one of the delayed latch pulse signals;

a latch circuit for receiving the output data and the delayed latch pulse signal selected by the delay selecting section, and latching the output data at a time of receiving the delayed latch pulse signal; and a delay control section for controlling the delay selecting section such that one of the delayed latch pulse signals with a delay amount different from that of the preceding delayed latch pulse signal is selected by the delay selecting section and the current delayed latch pulse signal is input to the latch circuit every time the delayed latch pulse signal is input to the latch circuit;

wherein the output data is data read out from a memory, the latch circuit is provided in an LSI which receives the data read out from the memory, the memory is a memory which outputs a strobe signal as well as the data, and the latch pulse signal to be input to the delay selecting section is substituted by the strobe signal output from the memory.

* * * * *